US008310002B2

United States Patent
Fujimoto

(10) Patent No.: US 8,310,002 B2
(45) Date of Patent: Nov. 13, 2012

(54) SEMICONDUCTOR DEVICE AND METHOD OF FORMING THE SAME

(75) Inventor: Hiroyuki Fujimoto, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 332 days.

(21) Appl. No.: 12/426,488

(22) Filed: Apr. 20, 2009

(65) Prior Publication Data

US 2009/0261408 A1    Oct. 22, 2009

(30) Foreign Application Priority Data

Apr. 21, 2008   (JP) ................. 2008-110210

(51) Int. Cl.
*H01L 29/78* (2006.01)
*H01L 21/336* (2006.01)

(52) U.S. Cl. . 257/330; 257/332; 257/302; 257/E29.262; 257/329; 257/382; 257/397; 257/E29.118; 257/E29.131; 257/E29.257; 257/E29.26

(58) Field of Classification Search ................ 257/330, 257/E29.262, 329, 382, 397, E29.118, E29.131, 257/E29.257, E29.26, 332, 302

See application file for complete search history.

(56) References Cited

U.S. PATENT DOCUMENTS 6,737,316 B2 *  5/2004  Lee ............................ 438/244
7,781,285 B2 *  8/2010  Kim et al. .................. 438/242

FOREIGN PATENT DOCUMENTS

| JP | 2004-319808 | 11/2004 |
| JP | 2005-303108 | 10/2005 |
| JP | 2005-303109 | 10/2005 |
| JP | 2005303109 | * 10/2005 |

* cited by examiner

*Primary Examiner* — Tom Thomas
*Assistant Examiner* — Benjamin Tzu-Hung Liu
(74) *Attorney, Agent, or Firm* — Young & Thompson

(57) ABSTRACT

A semiconductor device includes a semiconductor substrate, a first diffusion region, a gate insulating film, a gate electrode, a second diffusion region and a contact plug. The semiconductor substrate includes a base and at least a pillar. The first diffusion region is disposed in the base. The gate insulating film covers a side surface of the pillar. The gate electrode is separated from the pillar by the gate insulating film. The second diffusion region is disposed in an upper portion of the pillar. The contact plug is connected to the second diffusion region. The contact plug is connected to the entirety of the top surface of the pillar.

19 Claims, 24 Drawing Sheets

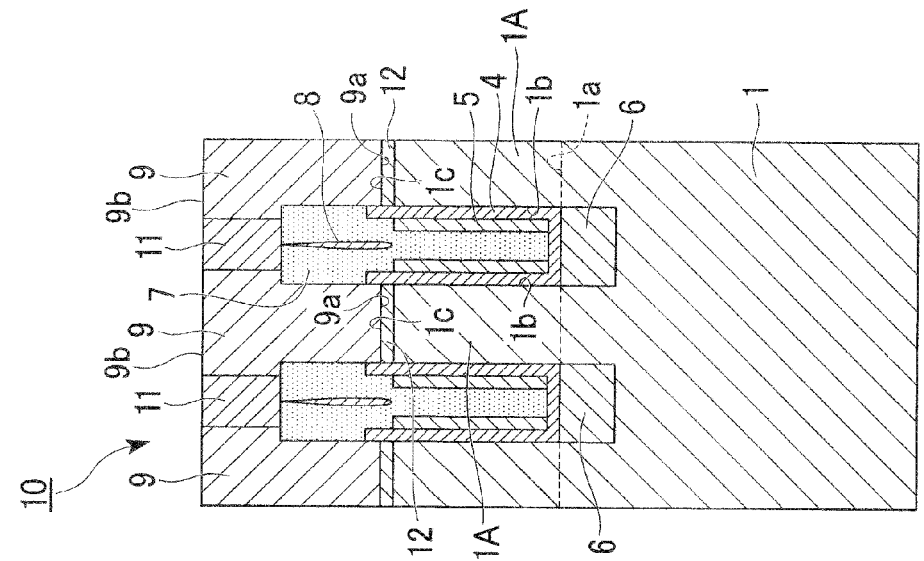
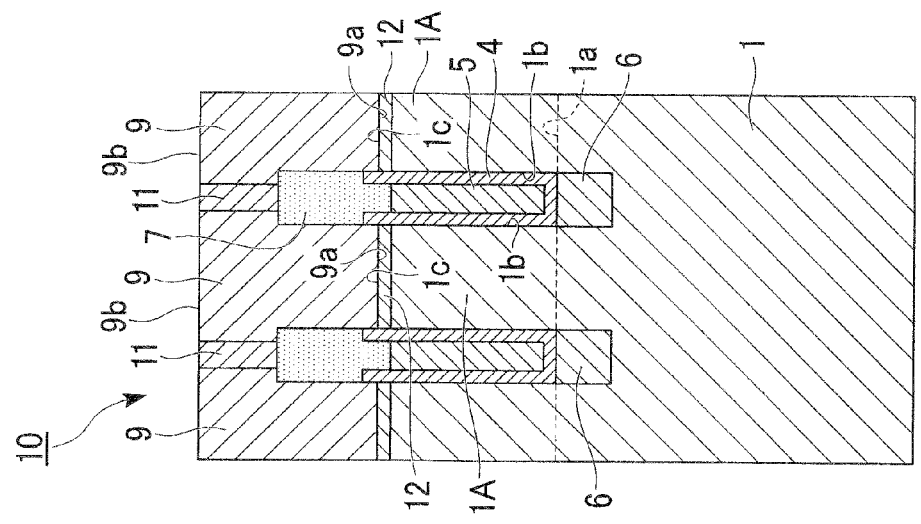
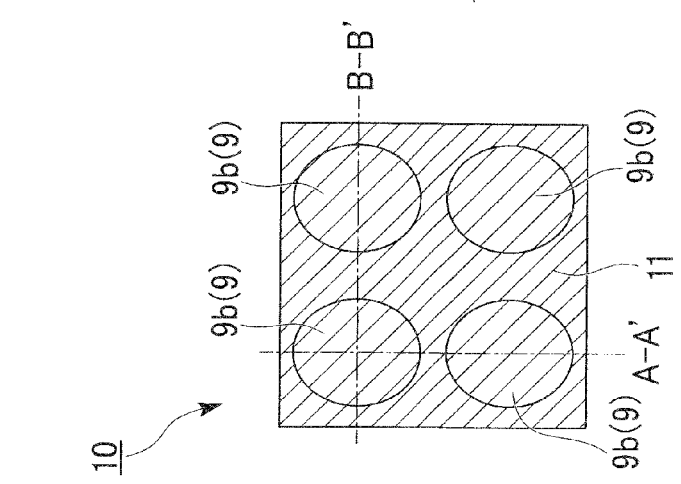

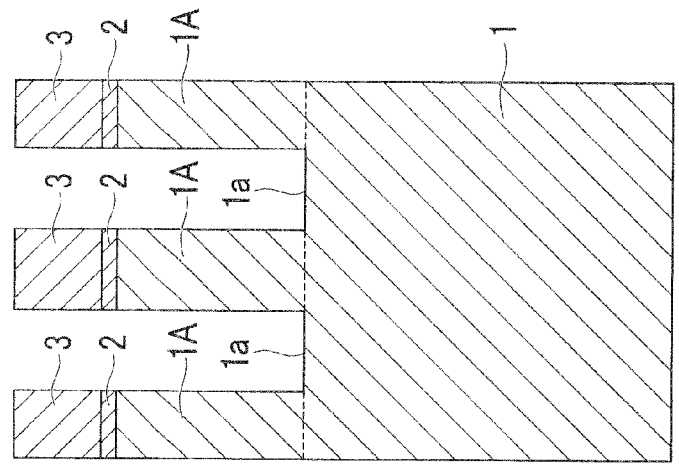
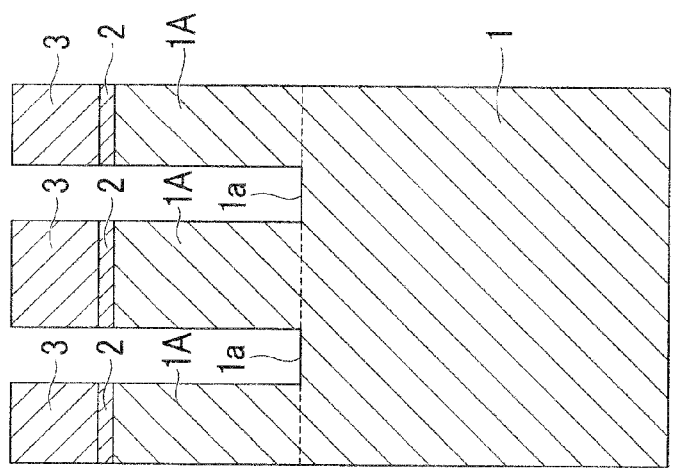
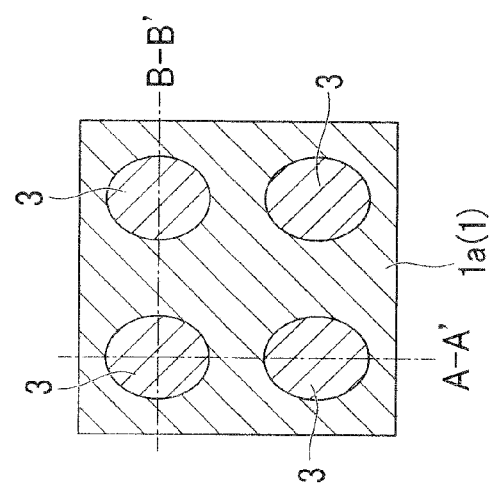

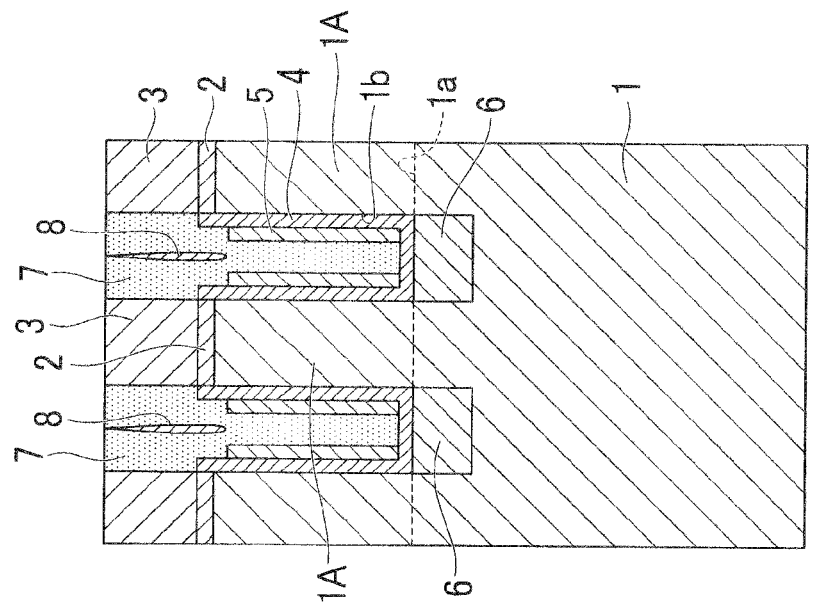
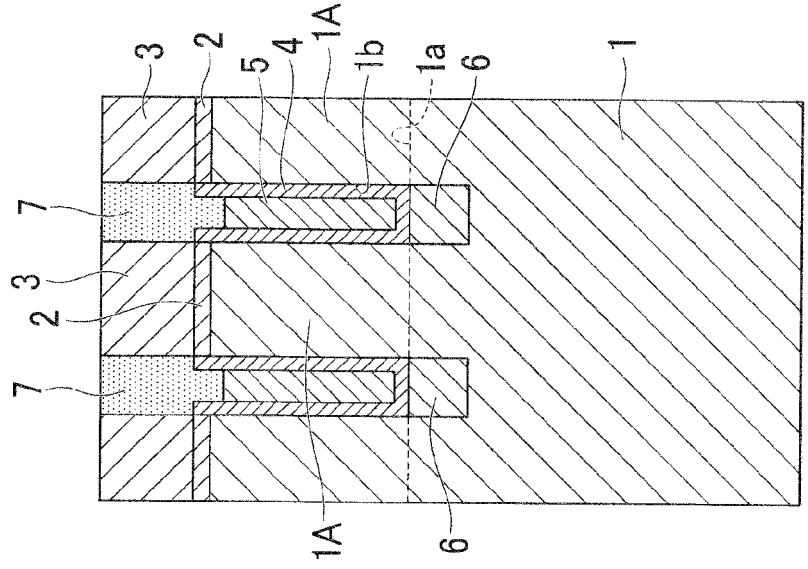
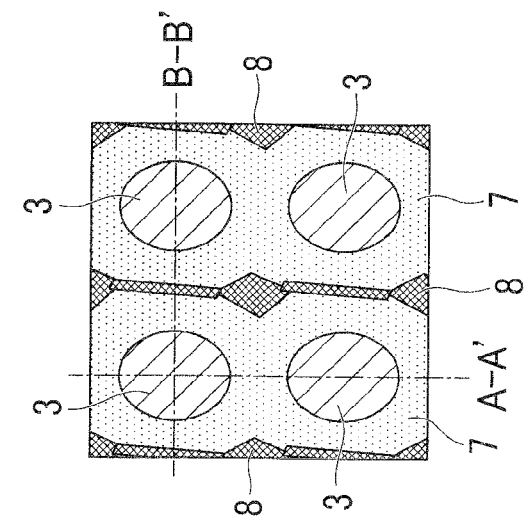

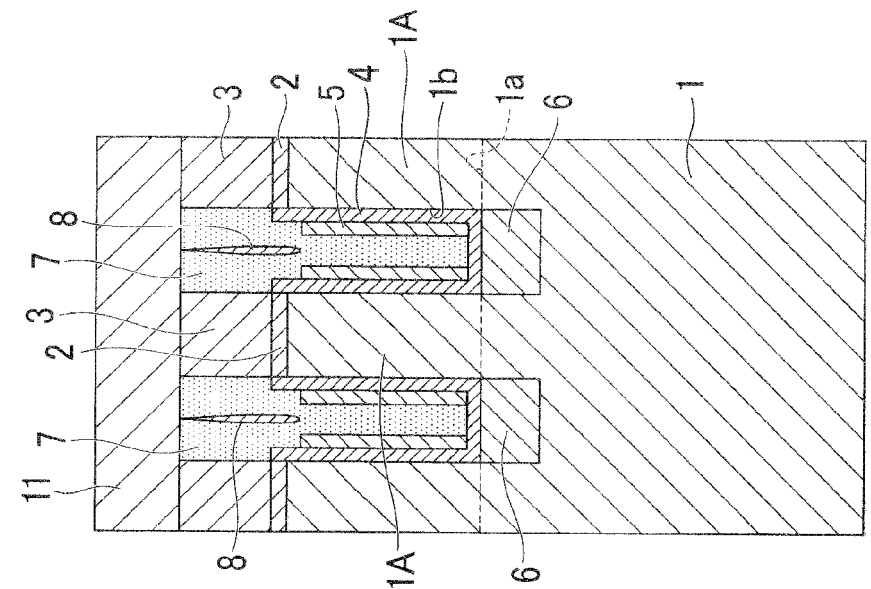
FIG. 6A
FIG. 6B
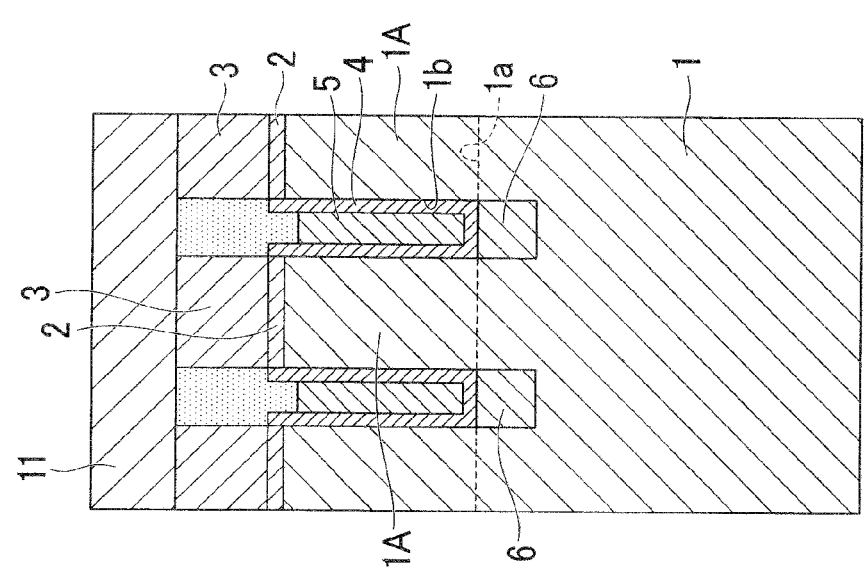
FIG. 6C
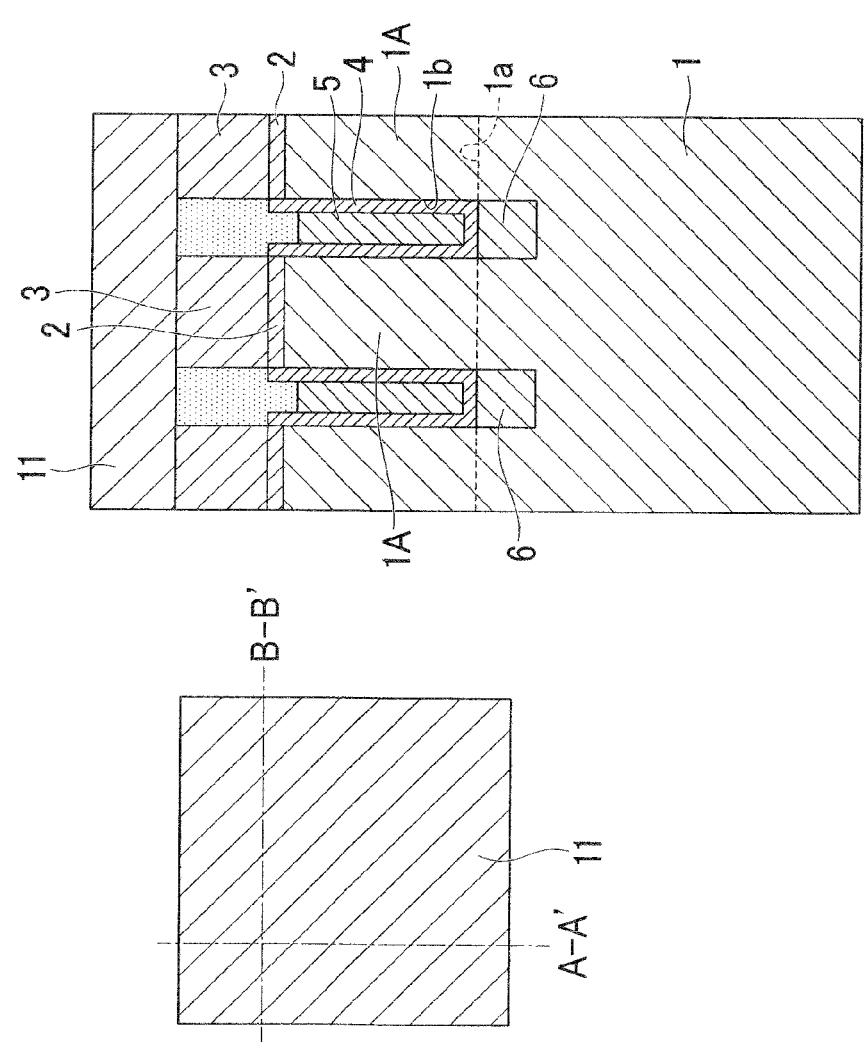

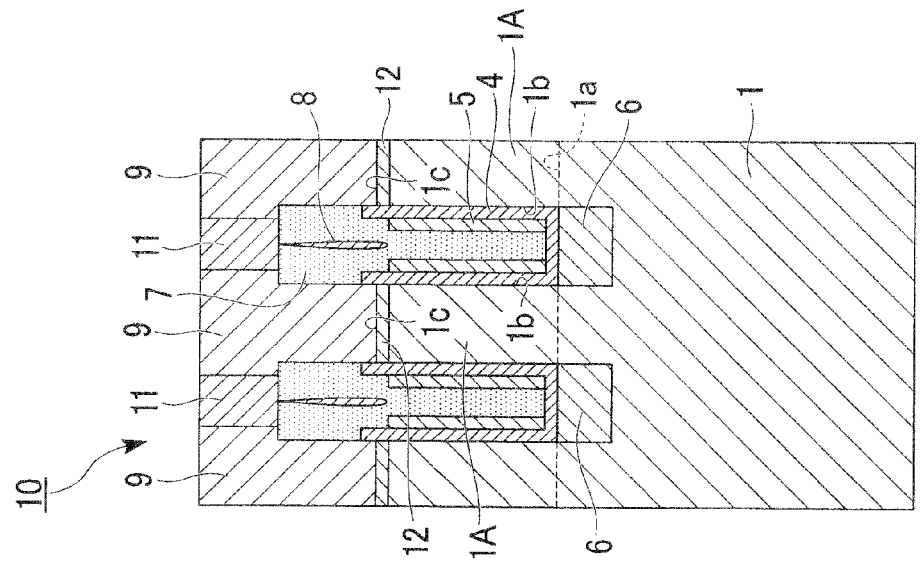
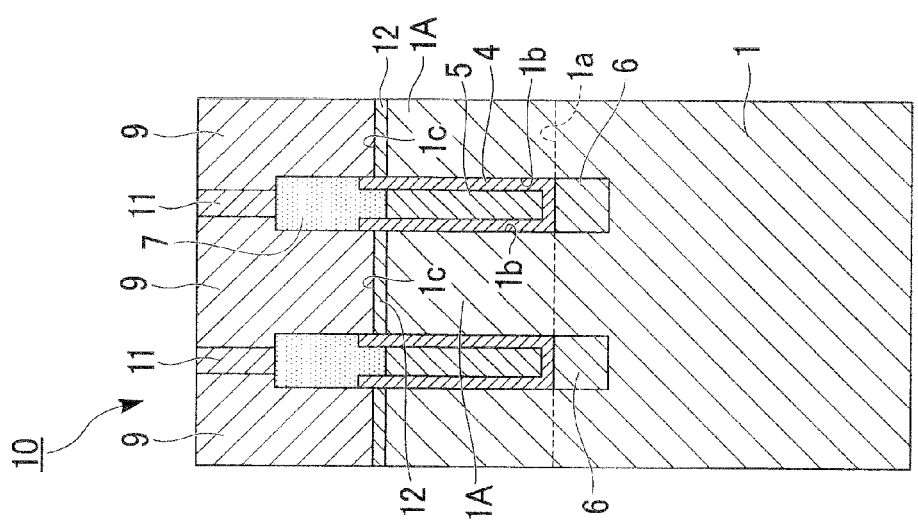
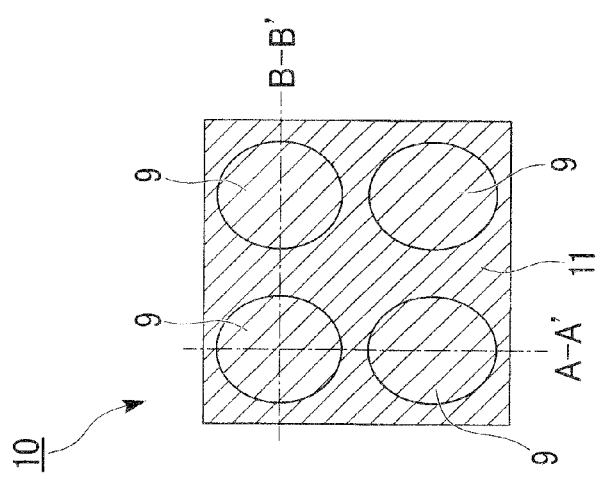

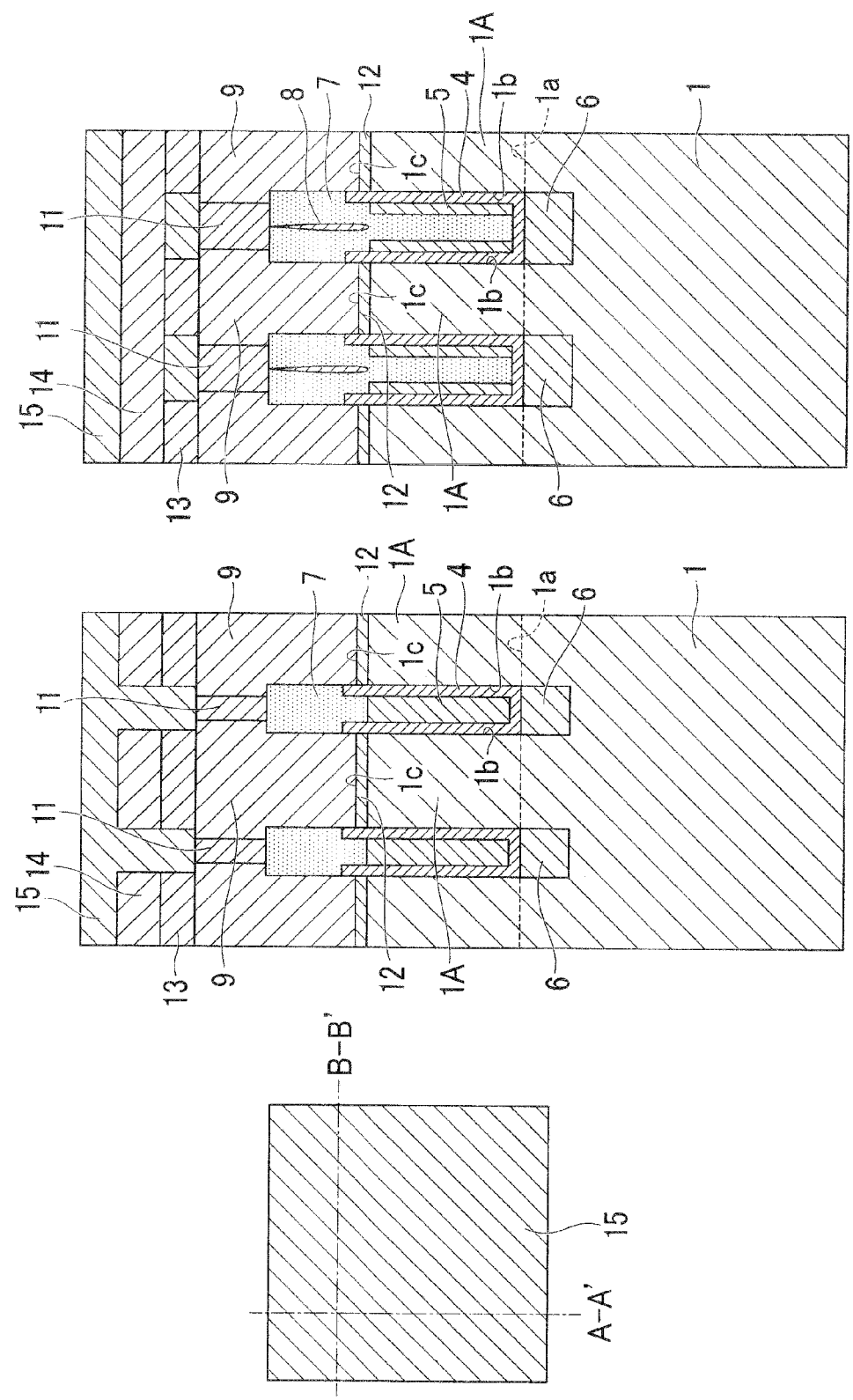

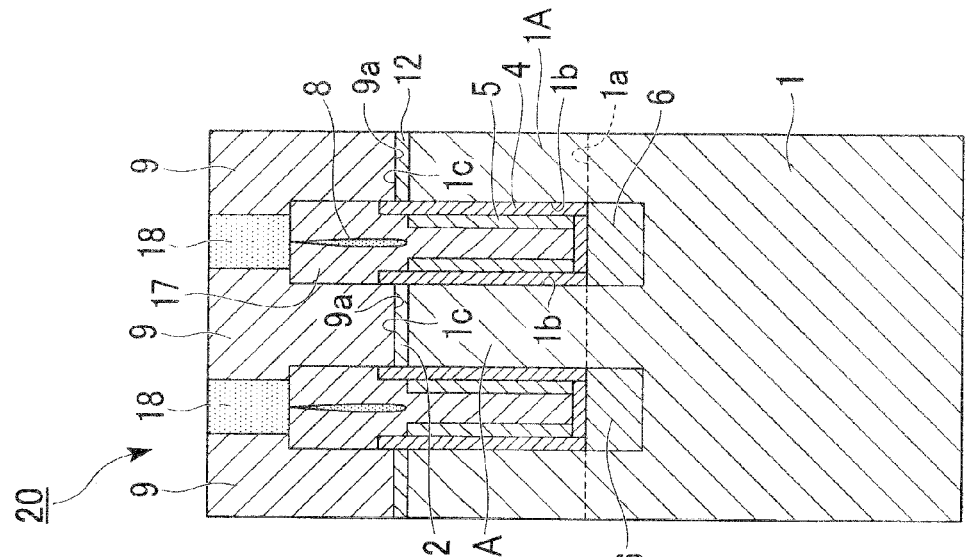
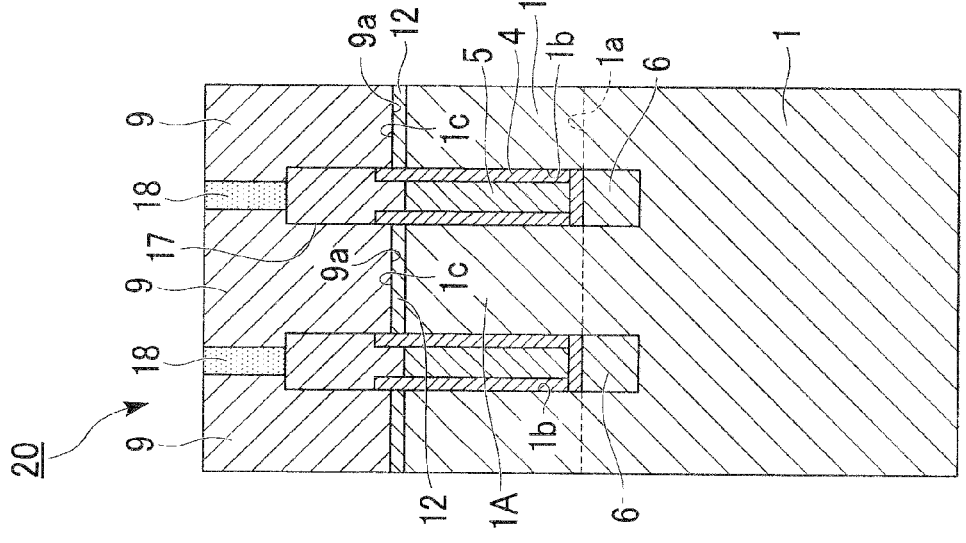
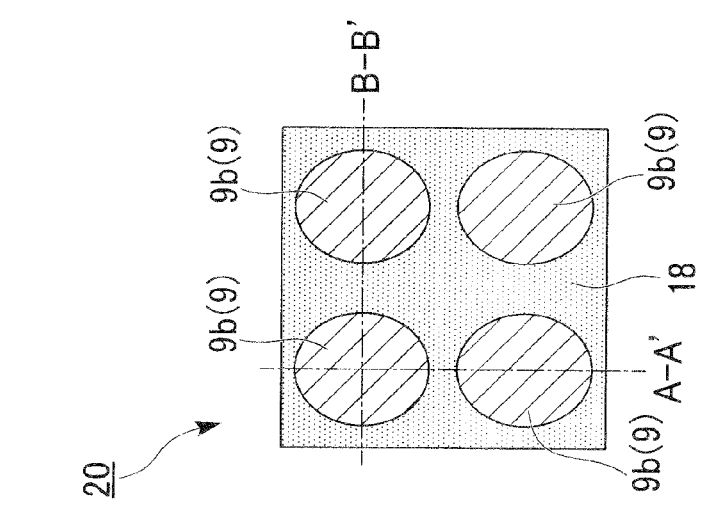

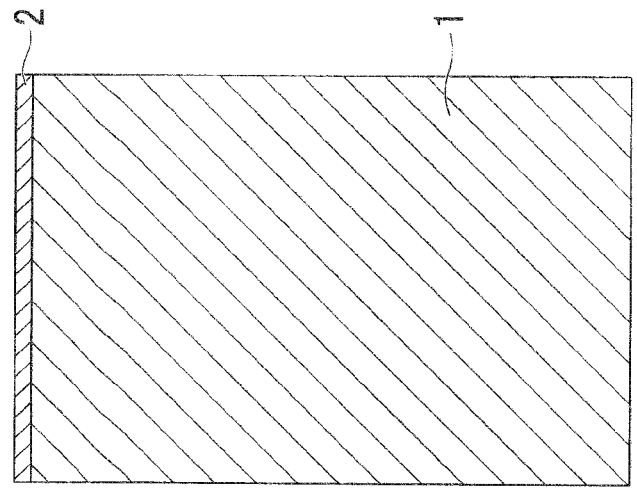
FIG. 10A  FIG. 10B
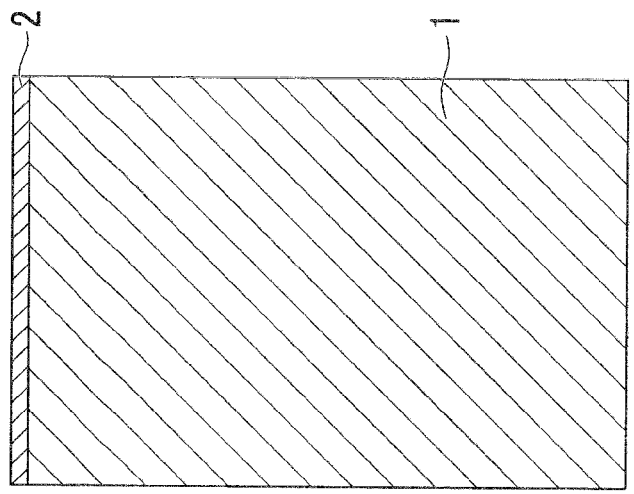
FIG. 10C
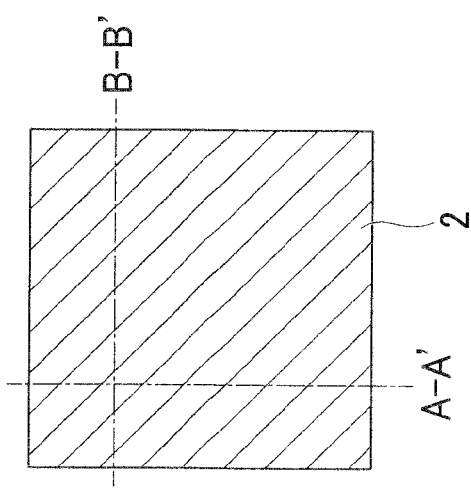

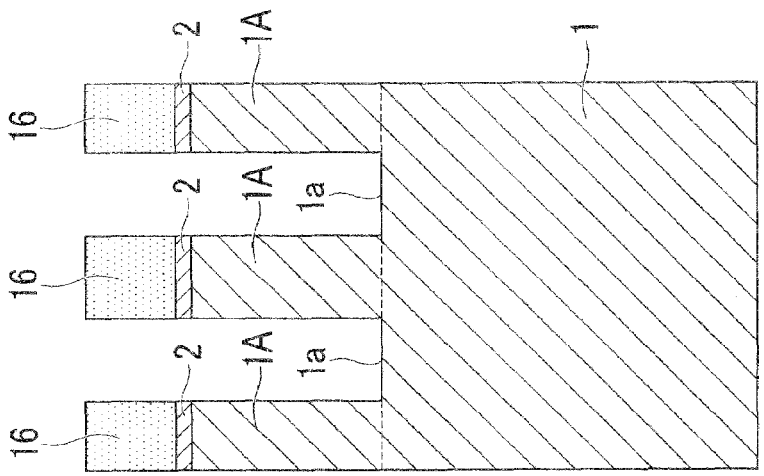
FIG. 11C  FIG. 11B
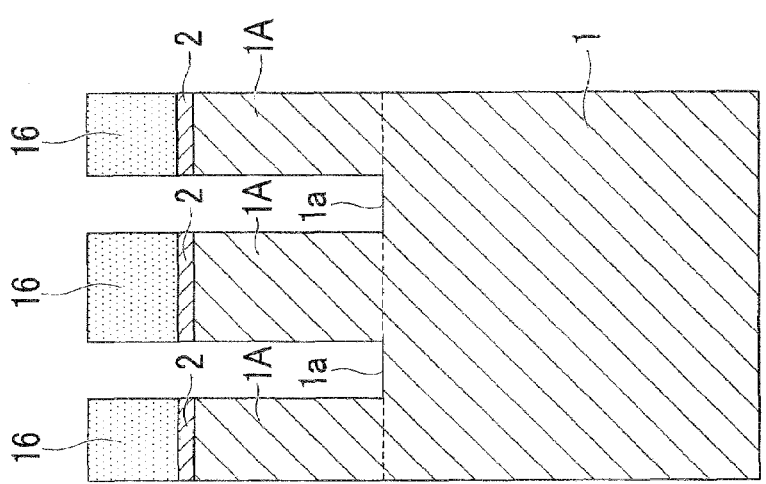
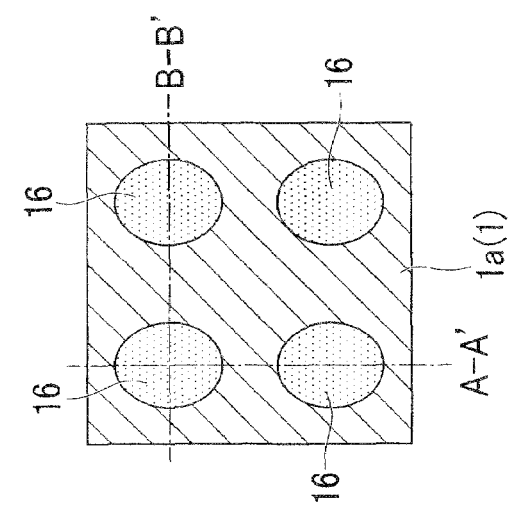
FIG. 11A

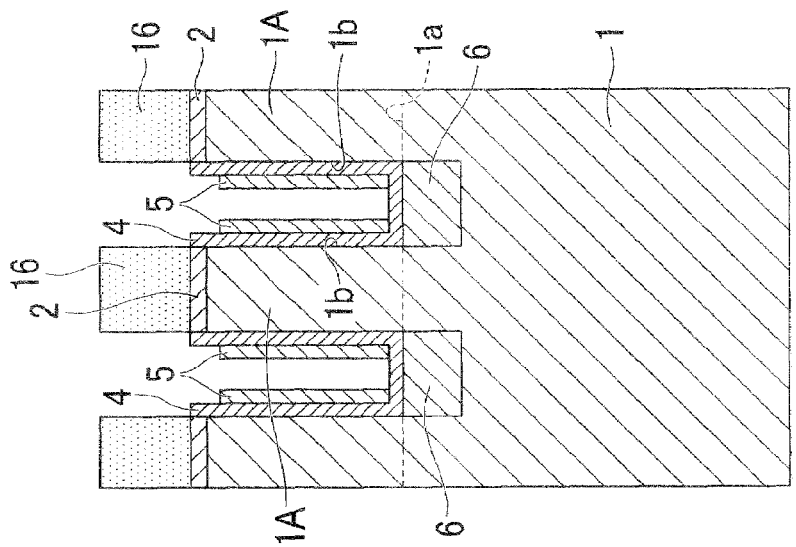
FIG. 12B    FIG. 12C
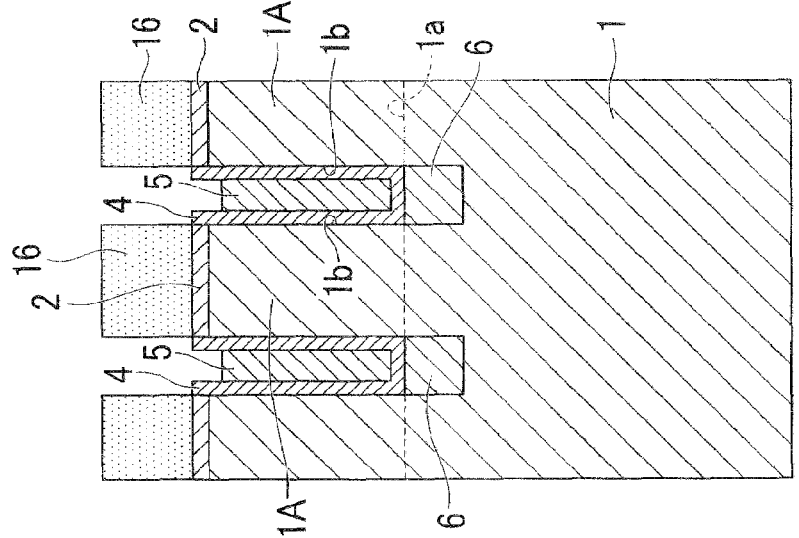
FIG. 12A
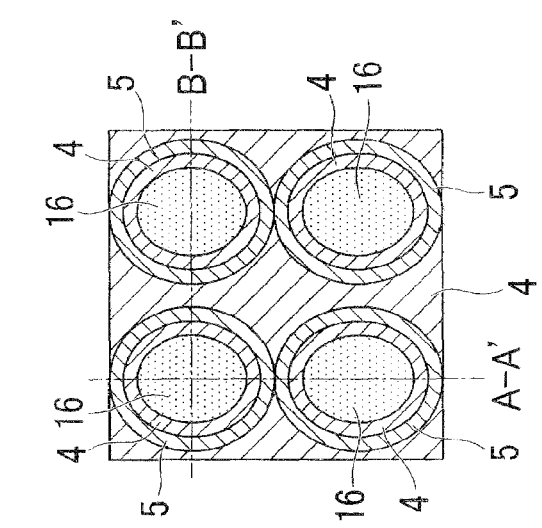

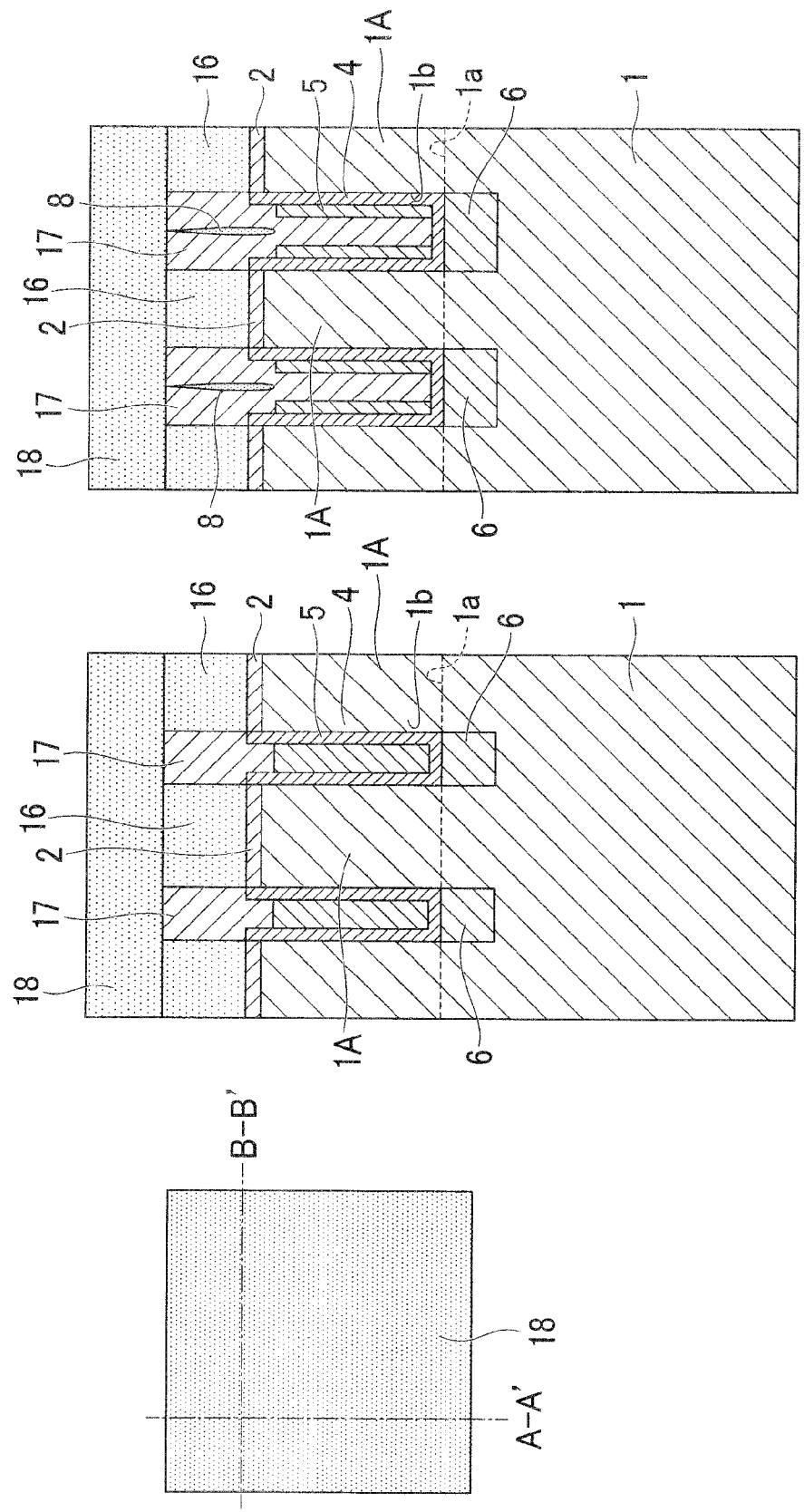

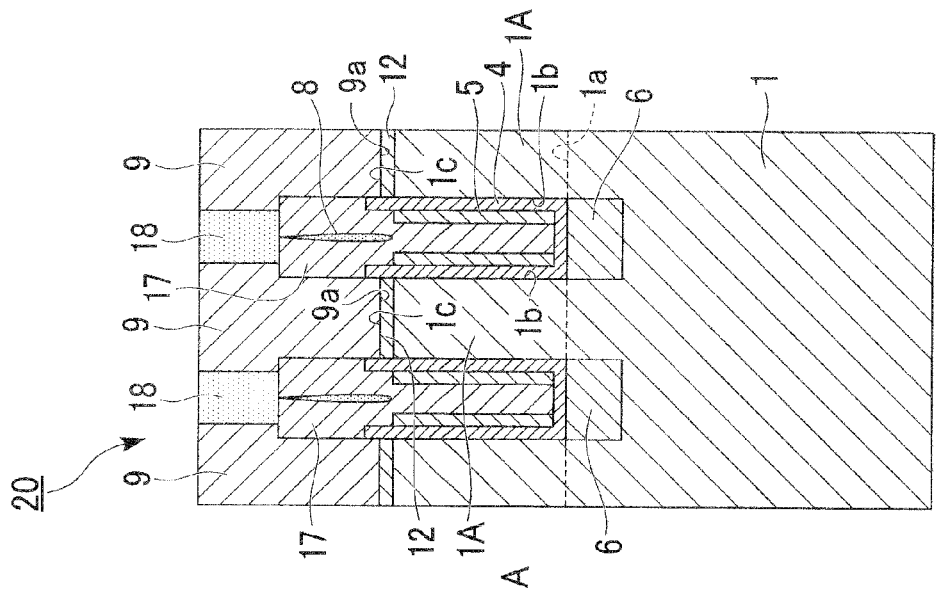
FIG. 15C
FIG. 15B
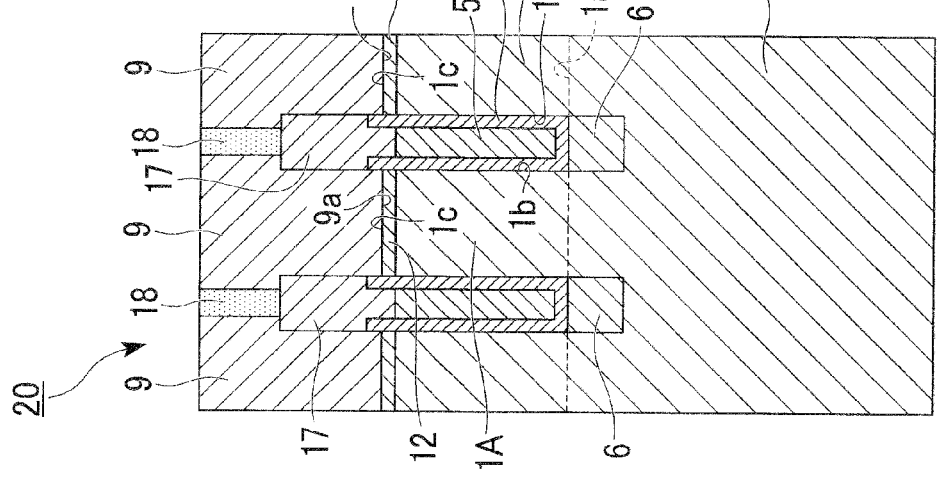
FIG. 15A
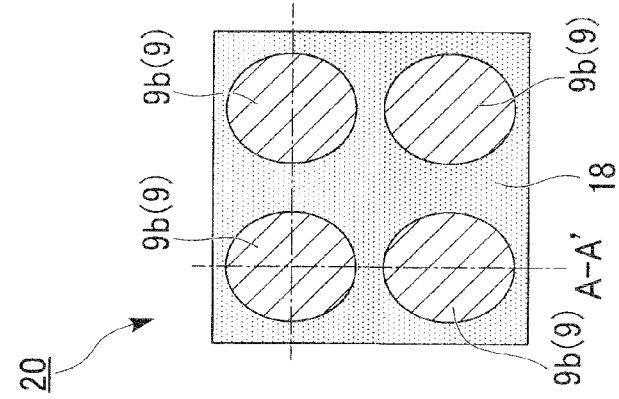

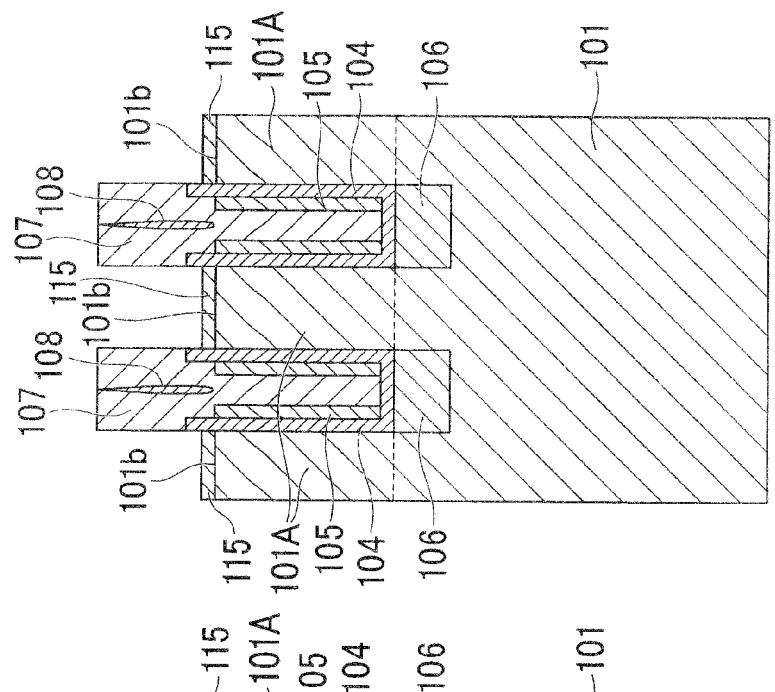
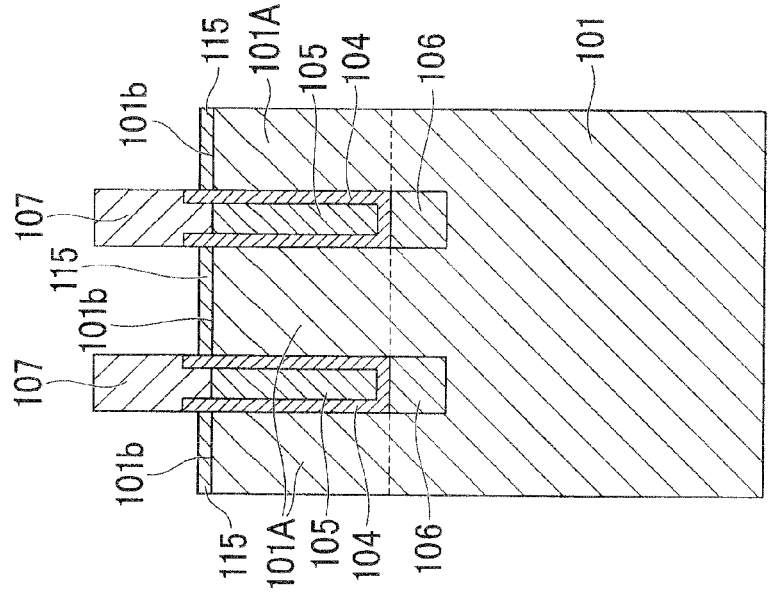
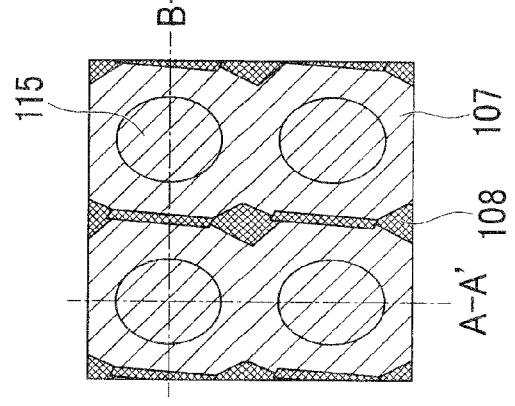

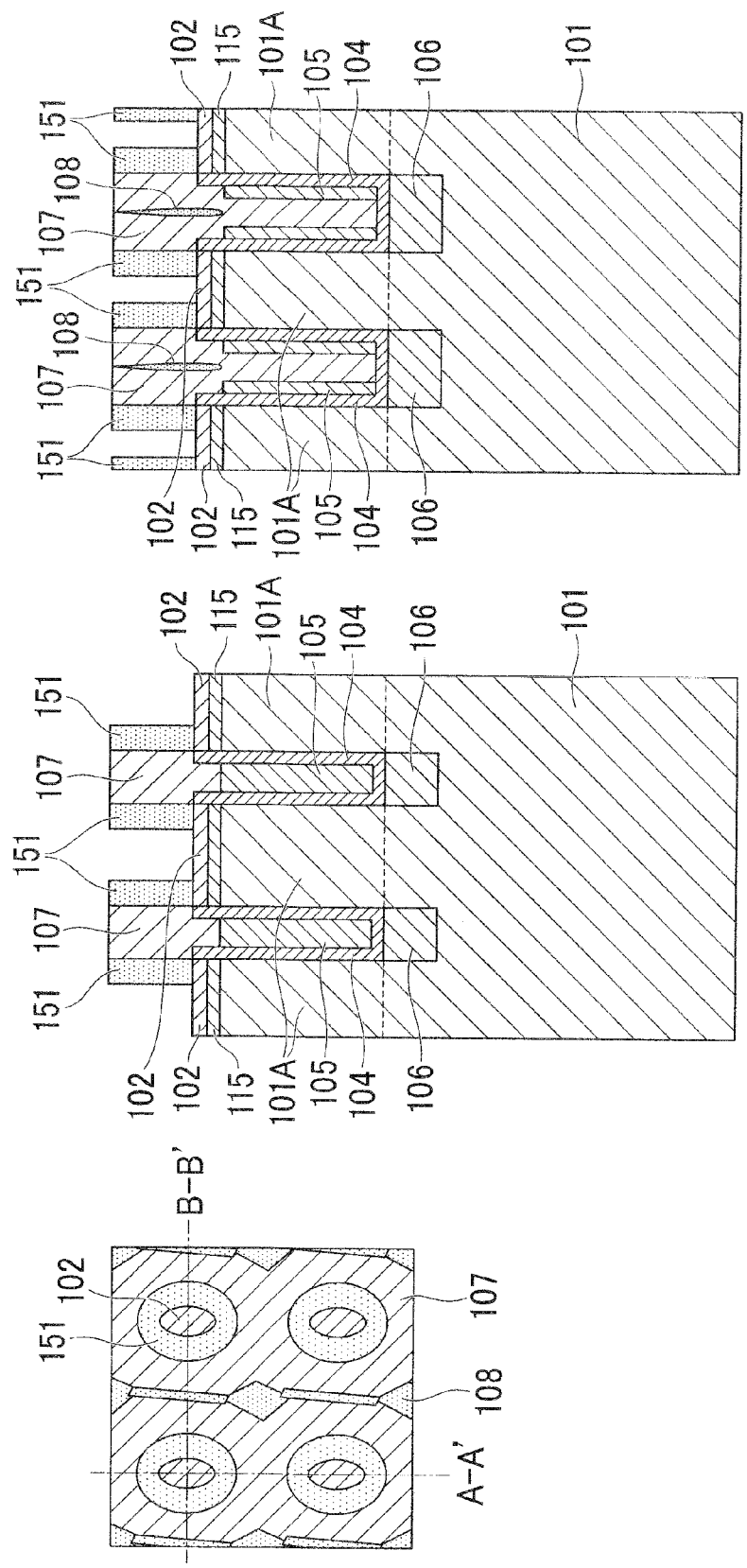

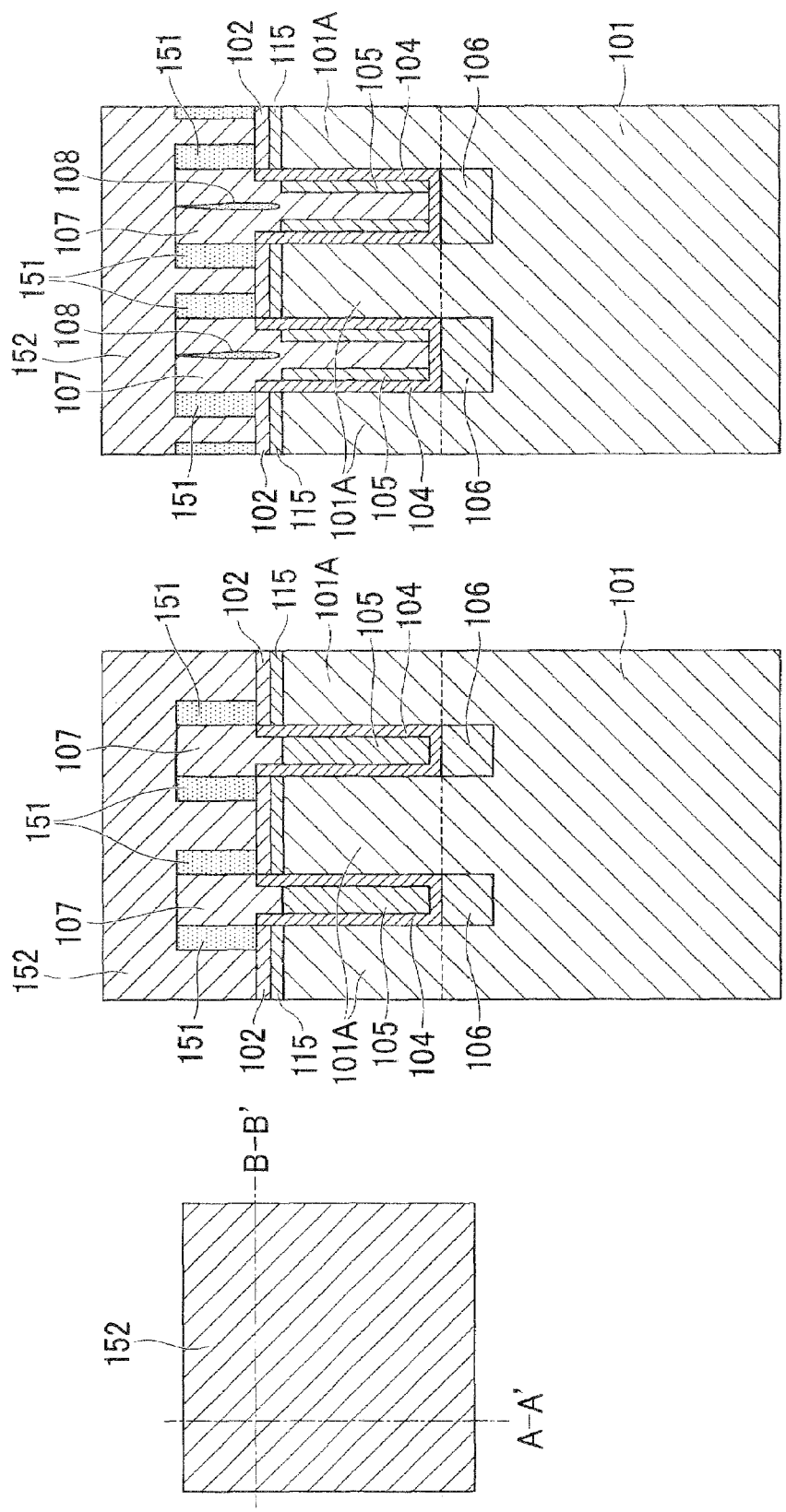

SEMICONDUCTOR DEVICE AND METHOD OF FORMING THE SAME

BACKGROUND OF THE INVENTION

1. Field of the Invention

The present invention generally relates to a semiconductor device and a method of forming the same. More specifically, the present invention relates to a semiconductor device that includes a three dimensional structure or a vertically extending structure such as a pillar structure. The pillar structure has upper and lower diffusion layers, and a conductor contacting the upper diffusion layer, wherein the conductor has a reduced contact resistance with the upper diffusion layer.

Priority is claimed on Japanese Patent Application No. 2008-110210, filed Apr. 21, 2008, the content of which is incorporated herein by reference.

2. Description of the Related Art

Dynamic random access memories (DRAMs) have an array of memory cells. Each memory cell includes a pair of a transistor and a capacitor. The degree of integration of memory cells in the DRAMs depends on the development of lithography technique. No further substantive increase in the degree of integration of memory cells can be available as long as the two dimensional array of memory cells is adopted and no further development of lithography technique is made. Namely, any further substantive increase in the degree of integration would be no longer available unless a three-dimensional structure or vertically extending structure is adopted.

SUMMARY

In one embodiment, a semiconductor device may include, but is not limited to, a semiconductor substrate, a first diffusion region, a gate insulating film, a gate electrode, a second diffusion region, and a contact plug. The semiconductor substrate includes a base and at least a pillar. The first diffusion region is disposed in the base. The gate insulating film covers a side surface of the pillar. The gate electrode is separated from the pillar by the gate insulating film. The second diffusion region is disposed in an upper portion of the pillar. The contact plug is connected to the second diffusion region. The contact plug is in contact with a top surface of the pillar. The entire area of the top surface of the pillar is covered by a bottom surface of the contact plug.

In another embodiment, the semiconductor device may include, but is not limited to, a semiconductor substrate, a plurality of pillars, at least a first diffusion region, a gate insulating film, a plurality of gate electrodes, a plurality of second diffusion regions, and a plurality of contact plugs. The plurality of pillars is disposed on the semiconductor substrate. The at least first diffusion region is formed in the semiconductor substrate. The gate insulating film covers a side surface of each of the pillars. The plurality of gate electrodes faces to side surfaces of each of the pillars with an intervention of the gate insulating film therebetween. The plurality of second diffusion regions is disposed in upper portions of each of the pillars. The plurality of contact plugs is connected to the second diffusion regions. Each of the contact plugs is in contact with top surfaces of each of the pillars. An entire area of the top surface of each of the pillars is covered by a bottom surface of a respective one of the contact plugs.

In still another embodiment, a method of forming a semiconductor device may include, but is not limited to, the following processes. A hard mask of a first insulating material is formed over a semiconductor substrate. The semiconductor substrate is selectively etched by using hard mask so that the semiconductor device includes a base and at least a pillar. The gate insulating film is formed, which covers a side surface of the pillar. A gate electrode is formed on the gate insulating film. The gate electrode is separated from the pillar by the gate insulating film. A first diffusion region is disposed in the base. A first inter-layer insulator of a second insulating material is formed on the gate insulating film. The first inter-layer insulator surrounds the pillar and the hard mask. A second inter-layer insulator of the first insulating material is formed over the first inter-layer insulator and the hard mask. The second inter-layer insulator is selectively removed, and the hard mask is removed, thereby forming a contact hole which reaches the entirety of the top surface of the pillar. A second diffusion region is disposed in an upper portion of the pillar. A contact plug is formed in the contact hole. The contact plug is connected to the entirety of the top surface of the pillar.

BRIEF DESCRIPTION OF THE DRAWINGS

The above features and advantages of the present invention will be more apparent from the following description of certain preferred embodiments taken in conjunction with the accompanying drawings, in which:

FIG. 1A is a fragmentary plan view illustrating a semiconductor device including pillar transistors in accordance with a first preferred embodiment of the present invention;

FIG. 1B is a fragmentary cross sectional elevation view, taken along an A-A' line of FIG. 1A, illustrating the semiconductor device in accordance with the first preferred embodiment of the present invention;

FIG. 1C is a fragmentary cross sectional elevation view, taken along a B-B' line of FIG. 1A, illustrating the semiconductor device in accordance with the first preferred embodiment of the present invention;

FIG. 3A is a fragmentary plan view illustrating a step, subsequent to the step of FIGS. 2A, 2B, and 2C, involved in a method of forming the semiconductor device including pillar transistors shown in FIGS. 1A, 1B, and 1C, in accordance with the first preferred embodiment of the present invention;

FIG. 3B is a fragmentary cross sectional elevation view, taken along all A-A' line of FIG. 3A, illustrating the step, subsequent to the step of FIGS. 2A, 2B, and 2C, involved in a method of forming the semiconductor device including pillar transistors in accordance with the first preferred embodiment of the present invention;

FIG. 3C is a fragmentary cross sectional elevation view, taken along a B-B' line of FIG. 3A, illustrating step, subsequent to the step of FIGS. 2A, 2B, and 2C, involved in a method of forming the semiconductor device including pillar transistors in accordance with the first preferred embodiment of the present invention;

FIG. 5A is a fragmentary plan view illustrating a step, subsequent to the step of FIGS. 4A, 4B, and 4C, involved in a method of forming the semiconductor device including pillar transistors shown in FIGS. 1A, 1B, and 1C, in accordance with the first preferred embodiment of the present invention;

FIG. 5B is a fragmentary cross sectional elevation view, taken along an A-A' line of FIG. 5A, illustrating the step, subsequent to the step of FIGS. 4A, 4B, and 4C, involved in a method of forming the semiconductor device including pillar transistors in accordance with the first preferred embodiment of the present invention;

FIG. 5C is a fragmentary cross sectional elevation view, taken along a B-B' line of FIG. 5A, illustrating step, subsequent to the step of FIGS. 4A, 4B, and 4C, involved in a method of forming the semiconductor device including pillar transistors in accordance with the first preferred embodiment of the present invention;

FIG. 6A is a fragmentary plan view illustrating a step, subsequent to the step of FIGS. 5A, 5B, and 5C, involved in a method of forming the semiconductor device including pillar transistors shown in FIGS. 1A, 1B, and 1C, in accordance with the first preferred embodiment of the present invention;

FIG. 6B is a fragmentary cross sectional elevation view, taken along an A-A' line of FIG. 6A, illustrating the step, subsequent to the step of FIGS. 5A, 5B, and 5C, involved in a method of forming the semiconductor device including pillar transistors in accordance with the first preferred embodiment of the present invention;

FIG. 6C is a fragmentary cross sectional elevation view, taken along a B-B' line of FIG. 6A, illustrating step, subsequent to the step of FIGS. 5A, 5B, and 5C, involved in a method of forming the semiconductor device including pillar transistors in accordance with the first preferred embodiment of the present invention;

FIG. 7A is a fragmentary plan view illustrating a step, subsequent to the step of FIGS. 6A, 6B, and 6C, involved in a method of forming the semiconductor device including pillar transistors shown in FIGS. 1A, 1B, and 1C, in accordance with the first preferred embodiment of the present invention;

FIG. 7B is a fragmentary cross sectional elevation view, taken along an A-A' line of FIG. 7A, illustrating the step, subsequent to the step of FIGS. 6A, 6B, and 6C, involved in a method of forming the semiconductor device including pillar transistors in accordance with the first preferred embodiment of the present invention;

FIG. 7C is a fragmentary cross sectional elevation view, taken along a B-B' line of FIG. 7A, illustrating step, subsequent to the step of FIGS. 6A, 6B, and 6C, involved in a method of forming the semiconductor device including pillar transistors in accordance with the first preferred embodiment of the present invention;

FIG. 8A is a fragmentary plan view illustrating a step, subsequent to the step of FIGS. 7A, 7B, and 7C, involved in a method of forming a phase change memory from the semiconductor device including pillar transistors shown in FIGS. 1A, 1B, and 1C, in accordance with the first preferred embodiment of the present invention;

FIG. 8B is a fragmentary cross sectional elevation view, taken along an A-A' line of FIG. 8A, illustrating the step, subsequent to the step of FIGS. 7A, 7B, and 7C, involved in a method of forming the phase change memory from the semiconductor device including pillar transistors in accordance with the first preferred embodiment of the present invention;

FIG. 8C is a fragmentary cross sectional elevation view, taken along a B-B' line of FIG. 8A, illustrating step, subsequent to the step of FIGS. 7A, 7B, and 7C, involved in a method of forming the phase change memory from the semiconductor device including pillar transistors in accordance with the first preferred embodiment of the present invention;

FIG. 9A is a fragmentary plan view illustrating a semiconductor device including pillar transistors in accordance with a second preferred embodiment of the present invention;

FIG. 9B is a fragmentary cross sectional elevation view, taken along an A-A' line of FIG. 9A, illustrating the semiconductor device in accordance with the second preferred embodiment of the present invention;

FIG. 9C is a fragmentary cross sectional elevation view, taken along a B-B' line of FIG. 9A, illustrating the semiconductor device in accordance with the second preferred embodiment of the present invention;

FIG. 10A is a fragmentary plan view illustrating a step involved in a method of forming the semiconductor device including pillar transistors shown in FIGS. 9A, 9B, and 9C, in accordance with the second preferred embodiment of the present invention;

FIG. 10B is a fragmentary cross sectional elevation view, taken along an A-A' line of FIG. 10A, illustrating the step involved in a method of forming the semiconductor device including pillar transistors in accordance with the second preferred embodiment of the present invention;

FIG. 10C is a fragmentary cross sectional elevation view, taken along a B-B' line of FIG. 10A, illustrating step involved in a method of forming the semiconductor device including pillar transistors in accordance with the second preferred embodiment of the present invention;

FIG. 11A is a fragmentary plan view illustrating a step, subsequent to the step of FIGS. 10A, 10B, and 10C, involved in a method of forming the semiconductor device including pillar transistors shown in FIGS. 9A, 9B, and 9C, in accordance with the second preferred embodiment of the present invention;

FIG. 11B is a fragmentary cross sectional elevation view, taken along an A-A' line of FIG. 11A, illustrating the step, subsequent to the step of FIGS. 10A, 10B, and 10C, involved in a method of forming the semiconductor device including pillar transistors in accordance with the second preferred embodiment of the present invention;

FIG. 11C is a fragmentary cross sectional elevation view, taken along a B-B' line of FIG. 11A, illustrating step, subsequent to the step of FIGS. 11A, 11B, and 11C, involved in a method of forming the semiconductor device including pillar transistors in accordance with the second preferred embodiment of the present invention;

FIG. 12A is a fragmentary plan view illustrating a step, subsequent to the step of FIGS. 11A, 11B, and 11C, involved in in a method of forming the semiconductor device including pillar transistors shown in FIGS. 9A, 9B, and 9C, in accordance with the second preferred embodiment of the present invention;

FIG. 12B is a fragmentary cross sectional elevation view, taken along an A-A' line of FIG. 12A, illustrating the step, subsequent to the step of FIGS. 11A, 11B, and 11C, involved in a method of forming the semiconductor device including pillar transistors in accordance with the second preferred embodiment of the present invention;

FIG. 12C is a fragmentary cross sectional elevation view, taken along a B-B' line of FIG. 12A, illustrating step, subsequent to the step of FIGS. 11A, 11B, and 1C, involved in a method of forming the semiconductor device including pillar transistors in accordance with the second preferred embodiment of the present invention;

FIG. 14A is a fragmentary plan view illustrating a step, subsequent to the step of FIGS. 13A, 13B, and 13C, involved in a method of forming the semiconductor device including pillar transistors shown in FIGS. 9A, 9B, and 9C, in accordance with the second preferred embodiment of the present invention;

FIG. 14B is a fragmentary cross sectional elevation view, taken along an A-A' line of FIG. 14A, illustrating the step, subsequent to the step of FIGS. 13A, 13B, and 13C, involved in a method of forming the semiconductor device including pillar transistors in accordance with the second preferred embodiment of the present invention;

FIG. 14C is a fragmentary cross sectional elevation view, taken along a B-B' line of FIG. 14A, illustrating step, subsequent to the step of FIGS. 13A, 13B, and 13C, involved in a method of forming the semiconductor device including pillar transistors in accordance with the second preferred embodiment of the present invention;

FIG. 15A is a fragmentary plan view illustrating a step, subsequent to the step of FIGS. 14A, 14B, and 14C, involved in a method of forming the semiconductor device including pillar transistors shown in FIGS. 9A, 9B, and 9C, in accordance with the second preferred embodiment of the present invention;

FIG. 15B is a fragmentary cross sectional elevation view, taken along an A-A' line of FIG. 15A, illustrating the step, subsequent to the step of FIGS. 14A, 14B, and 14C, involved in a method of forming the semiconductor device including pillar transistors in accordance with the second preferred embodiment of the present invention;

FIG. 15C is a fragmentary cross sectional elevation view, taken along a B-B' line of FIG. 15A, illustrating step, subsequent to the step of FIGS. 14A, 14B, and 14C, involved in a method of forming the semiconductor device including pillar transistors in accordance with the second preferred embodiment of the present invention;

FIG. 20A is a fragmentary plan view illustrating a step subsequent to the step of FIGS. 19A, 19B and 19C, involved in the method of forming the semiconductor device in accordance with the related art;

FIG. 20B is a fragmentary cross sectional elevation view, taken along an A-A' line of FIG. 20A, illustrating the same step as in FIG. 20A, involved in the method of forming the semiconductor device in accordance with the related art;

FIG. 20C is a fragmentary cross sectional elevation view, taken along a B-B' line of FIG. 20A, illustrating the same step as in FIG. 20A, involved in the method of forming the semiconductor device in accordance with the related art;

FIG. 22A is a fragmentary plan view illustrating a step subsequent to the step of FIGS. 19A, 19B and 19C, involved in the other method of forming the semiconductor device in accordance with the related art;

FIG. 22B is a fragmentary cross sectional elevation view, taken along an A-A' line of FIG. 22A, illustrating the same step as in FIG. 22A, involved in the other method of forming the semiconductor device in accordance with the related art;

FIG. 22C is a fragmentary cross sectional elevation view, taken along a B-B' line of FIG. 22A, illustrating the same step as in FIG. 22A, involved in the other method of forming the semiconductor device in accordance with the related art;

FIG. 23A is a fragmentary plan view illustrating a step subsequent to the step of FIGS. 22A, 22B and 22C, involved in the other method of forming the semiconductor device in accordance with the related art;

FIG. 23B is a fragmentary cross sectional elevation view, taken along an A-A' line of FIG. 23A, illustrating the same step as in FIG. 23A, involved in the other method of forming the semiconductor device in accordance with the related art;

FIG. 23C is a fragmentary cross sectional elevation view, taken along a B-B' line of FIG. 23A, illustrating the same step as in FIG. 23A, involved in the other method of forming the semiconductor device in accordance with the related art;

DETAILED DESCRIPTION OF THE PREFERRED EMBODIMENTS

Before describing the present invention, the related art will be explained in detail, in order to facilitate the understanding of the present invention Japanese Unexamined Patent Application, First Publication, No 2004-319808 discloses a transistor that includes a three-dimensional structure that vertically extends. The transistor has a pillar structure of silicon. The pillar structure includes a second diffusion layer, a first diffusion layer, a channel region and a gate electrode. The second diffusion layer is positioned at the top of the pillar structure. The first diffusion layer is positioned at the bottom of the pillar structure. The channel region is positioned below the second diffusion layer and above the first diffusion layer. The channel region has a generally pillar-shape. The channel region extends vertically. The channel region is surrounded by the gate electrode. One of the top and first diffusion layers performs as a drain and the other performs as a source. The pillar transistor is a kind of MOS transistors.

Process for forming a semiconductor device including an array of pillar transistors will be described with reference to the drawings of FIGS. 16A through 21C.

Figures 16B, 16C:
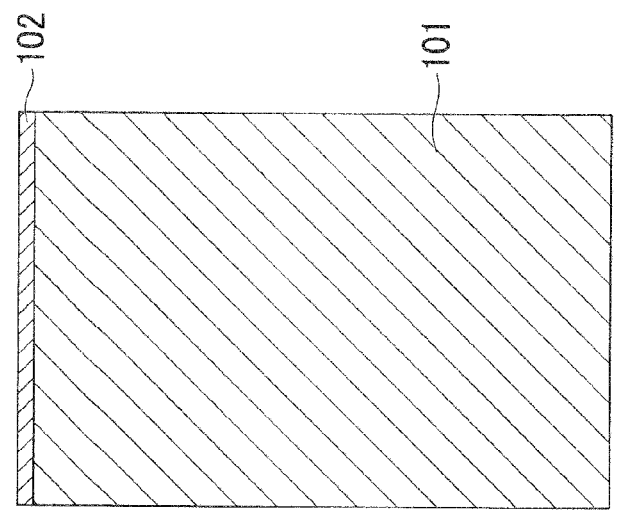
FIG. 16B is a fragmentary cross sectional elevation view, taken along an A-N line of FIG. 16A, illustrating the same step as in FIG. 16A, involved in the method of forming the semiconductor device in accordance with the related art.
FIG. 16C is a fragmentary cross sectional elevation view, taken along a B-B' line of FIG. 16A, illustrating the same step as in FIG. 16A, involved in the method of forming the semiconductor device in accordance with the related art.
Figure 16A:
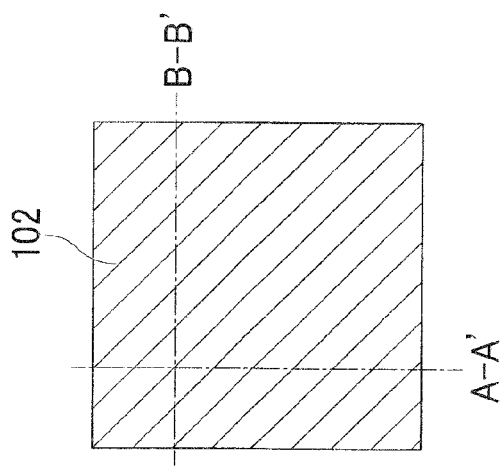
FIG. 16A is a fragmentary plan view illustrating a step involved in a method of forming a semiconductor device including an array of pillar transistors in accordance with the related art.

With reference to FIGS. 16A, 16B and 16C, a semiconductor substrate 101 such as a silicon substrate 101 is prepared. A thermal oxidation process is carried out to form an oxide film 102 such as a silicon oxide film 102 on a surface of the semiconductor substrate 101. In some cases, the thermal oxidation process can be carried out at a temperature of about 850° C. for 10 minutes.

Figure 17C:
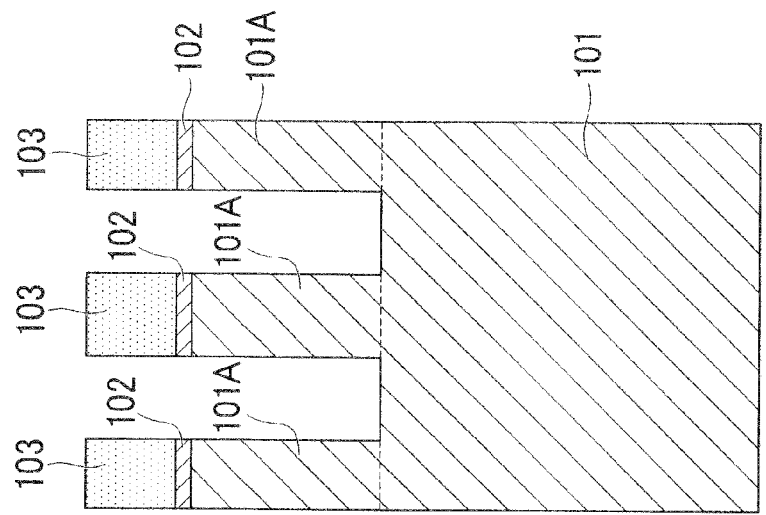
FIG. 17C is a fragmentary cross sectional elevation view, taken along a B-B' line of FIG. 17A, illustrating the same step as in FIG. 17A, involved in the method of forming the semiconductor device in accordance with the related art.
Figure 17B:
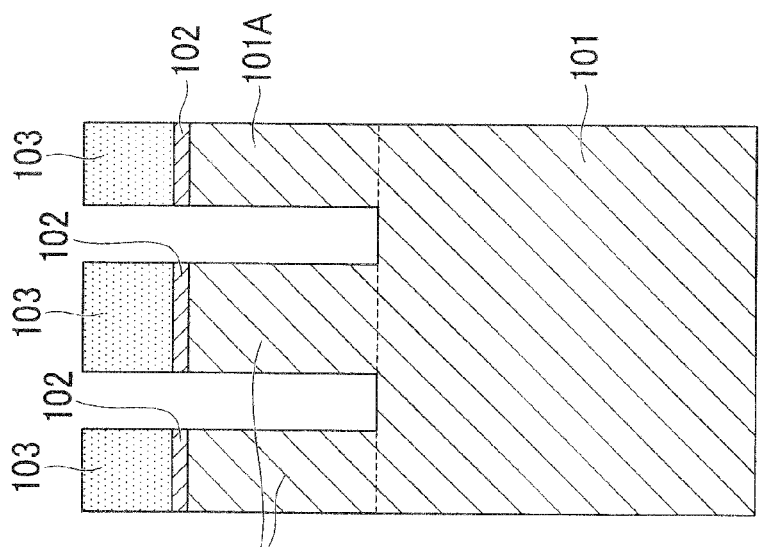
FIG. 17B is a fragmentary cross sectional elevation view, taken along an A-A' line of FIG. 17A, illustrating the same step as in FIG. 17A, involved in the method of forming the semiconductor device in accordance with the related art.
Figure 17A:
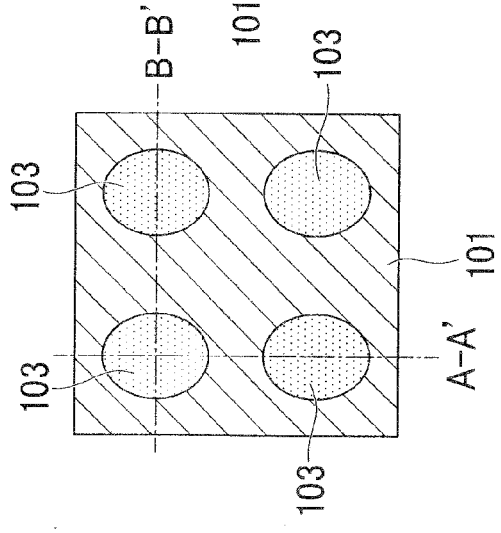
FIG. 17A is a fragmentary plan view illustrating a step subsequent to the step of FIGS. 16A, 16B and 16C, involved in the method of forming the semiconductor device in accordance with the related art.

With reference to FIGS. 17A, 17B and 17C, a silicon nitride film is formed over the oxide film 102 such as the silicon oxide film 102. In some cases, the thickness of the silicon nitride film may be, but is not limited to, 100 nanometers. A lithography process and a dry etching process are carried out to pattern the silicon nitride film, thereby forming hard masks 103 on the oxide film 102 such as the silicon oxide film 102. In some cases, the hard masks 103 may each have, but not limited to, an elliptical shape in plan view as shown in FIG. 17A, wherein the ellipse of the hard masks 103 has a semi-major axis that is parallel to the A-A' line of FIG. 17A, and a semi-minor axis that is parallel to the B-B' line of FIG. 17A.

A dry etching process is carried out using the hard masks 103 to selectively and anisotropically etch the oxide film 102 and the semiconductor substrate 101, thereby forming a plurality of pillars 101A of semiconductor or silicon. The plurality of pillars 101A of semiconductor or silicon is a part of the semiconductor substrate 101. In other words, the semiconductor substrate 101 includes the plurality of pillars 101A and a base portion. The plurality of pillars 101A extends vertically from the base portion of the semiconductor substrate 101 as shown in FIGS. 17B and 17C. The plurality of pillars 101A extends vertically from the semiconductor substrate 101. Each pillar 101A has a side surface 101a.

Figure 18C:
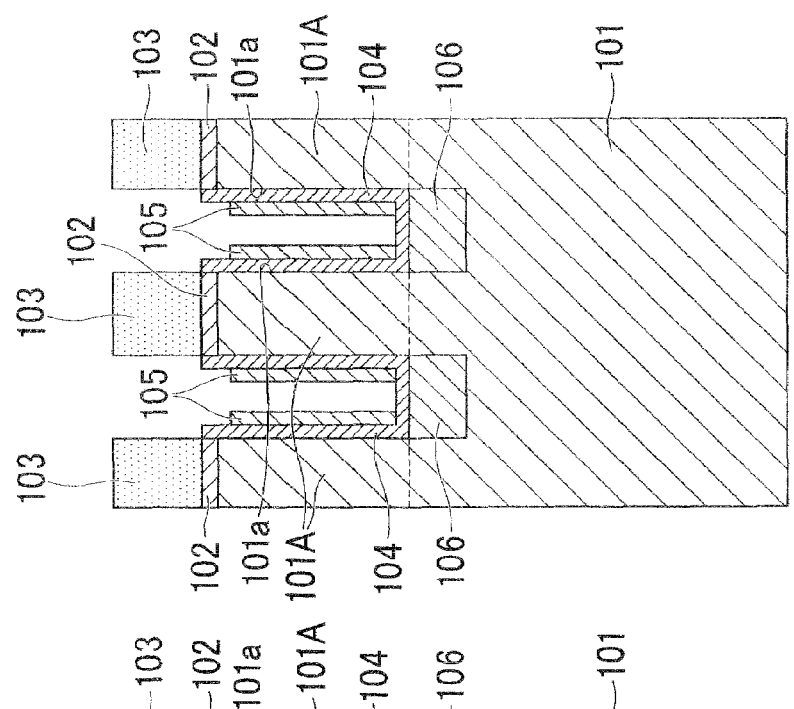
FIG. 18C is a fragmentary cross sectional elevation view, taken along a B-B' line of FIG. 18A, illustrating the same step as in FIG. 18A, involved in the method of forming the semiconductor device in accordance with the related art.
Figure 18B:
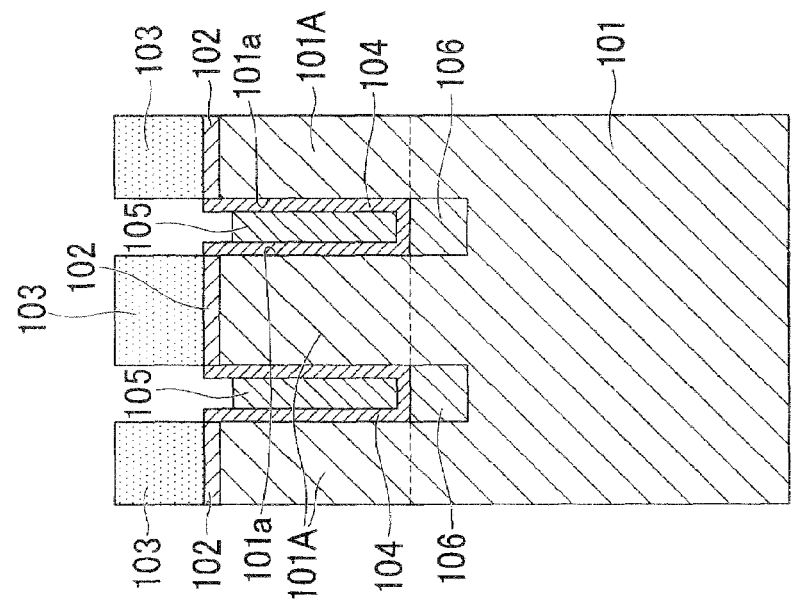
FIG. 18B is a fragmentary cross sectional elevation view, taken along an A-A' line of FIG. 18A, illustrating the same step as in FIG. 18A, involved in the method of forming the semiconductor device in accordance with the related art.
Figure 18A:
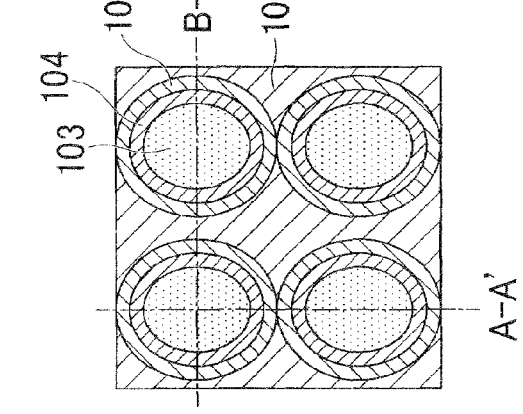
FIG. 18A is a fragmentary plan view illustrating a step subsequent to the step of FIGS. 17A, 17B and 17C, involved in the method of forming the semiconductor device in accordance with the related art.

With reference to FIGS. 18A, 18B and 18C, a gate insulating films 104 such as a gate oxide film 104 is formed on the surfaces of the semiconductor substrate 101. Namely, the gate insulating film 104 is formed on the side surfaces 101a of the plurality of pillars 101A and the surface of the semiconductor substrate 101. The gate insulating film 104 extends along the side surfaces 101a of the plurality of pillars 101A and the surface of the semiconductor substrate 101. The gate oxide film 104 surrounds each of the plurality of pillars 101A. The gate oxide film 104 can be formed by, but not limited to, a thermal oxidation process. In some cases, the thermal oxidation process can be carried out at a temperature of about 1000° C. for one minute. The plurality of pillars 101A that are each surrounded by the gate oxide film 104 defines an inter-space. The inter-space is defined by the surface of the semiconductor substrate 101 and by the gate oxide film 104 extending along the side surfaces 101a of the plurality of pillars 101A. In other words, the inter-space is a space that extends outside the plurality of pillars 101A.

A plurality of gate electrodes 105 is formed on the gate oxide film 104 that surrounds each of the plurality of pillars 101A. Each gate electrode 105 is in contact with a part of the gate oxide film 104, wherein the part of the gate oxide film 104 is in contact with the side surface 101a of the pillar 101A. Each gate electrode 105 surrounds the pillar 101A and a part of the gate oxide film 104, wherein the part of the gate oxide film 104 is in contact with the side surface 101a of the pillar 101A. Each pillar 101A is surrounded by the gate oxide film 104 and the gate electrode 105. As shown in FIGS. 18A and 18B, first pair of two adjacent gate electrodes 105 are in contact with each other. The first pair of two adjacent gate electrodes 105 surround first pair of two adjacent pillars 101A that are aligned on the semi-major axis, wherein the first pair of two adjacent gate electrodes 105 are in contact with each other at a contact point in plan view that is positioned on the semi-major axis. As shown in FIGS. 18A and 18C, second pair of two adjacent gate electrodes 105 are separate from each other. The second pair of two adjacent gate electrodes 105 surround second pair of two adjacent pillars 101A that are aligned on the semi-minor axis, wherein the second pair of two adjacent gate electrodes 105 separate each other.

In some cases, the thickness of each gate electrode 105 may be so thick that the first pair of two adjacent gate electrodes 105 are in contact with each other at a contact point in plan view that is positioned on the semi-major axis as shown in FIGS. 18A and 18B, while the second pair of two adjacent gate electrodes 105 are separate from each other as shown in FIGS. 18A and 18C. No spatial gap is present between the first pair of two adjacent gate electrodes 105 that are aligned on the semi-major axis parallel to the A-A' line of FIGS. 18A and 18B. A spatial gap is present between the second pair of two adjacent gate electrodes 105 that are aligned on the semi-minor axis parallel to the B-B' line of FIGS. 18A and 18C.

In some cases, the gate electrodes 105 may be made of, but not limited to, a polysilicon that contains an impurity. Typically, the gate electrodes 105 may be made of, but not limited to, an in-situ phosphorus-doped polysilicon. In this case, the gate electrodes 105 can be formed by follows. An in-situ phosphorus-doped polysilicon film is formed entirely over the semiconductor substrate 101 by a chemical vapor deposition process. The in-situ phosphorus-doped polysilicon film is formed on the gate oxide film 104 and on the hard masks 103. A dry etching process can be carried out to etch back the in-situ phosphorus-doped polysilicon film, thereby forming the gate electrodes 105. Each gate electrode 105 is in contact with a part of the gate oxide film 104, wherein the part of the gate oxide film 104 is in contact with the side surface 101a of the pillar 101A. Each gate electrode 105 surrounds the pillar 101A and a part of the gate oxide film 104, wherein the part of the gate oxide film 104 is in contact with the side surface 101a of the pillar 101A.

First diffusion layers 106 are selectively formed in shallow regions of the semiconductor substrate 101. The part of the gate insulating film 104 extends over the surface of the semiconductor substrate 101. The shallow regions extend under the surface of the semiconductor substrate 101. The first diffusion layers 106 are positioned under the part of the gate insulating film 104, wherein the part of the gate insulating film 104 extends over the surface of the semiconductor substrate 101. The first diffusion layers 106 do not extend under the pillars 101A. The first diffusion layers 106 extend within the shallow region of the semiconductor substrate 101, except under the pillars 101A that extend upwardly from the semiconductor substrate 101. In some cases, the first diffusion layers 106 may contain, but not limited to, phosphorous. Typically, the first diffusion layers 106 can be formed by, but not limited to, a selective ion-implantation process. The selective ion-implantation process can be carried out by introducing phosphorous ions into the semiconductor substrate 101, except under the pillars 101A. The dose of the ion-implantation may be, but is not limited to, about 1E15 cm$^{-2}$.

Figure 19B:
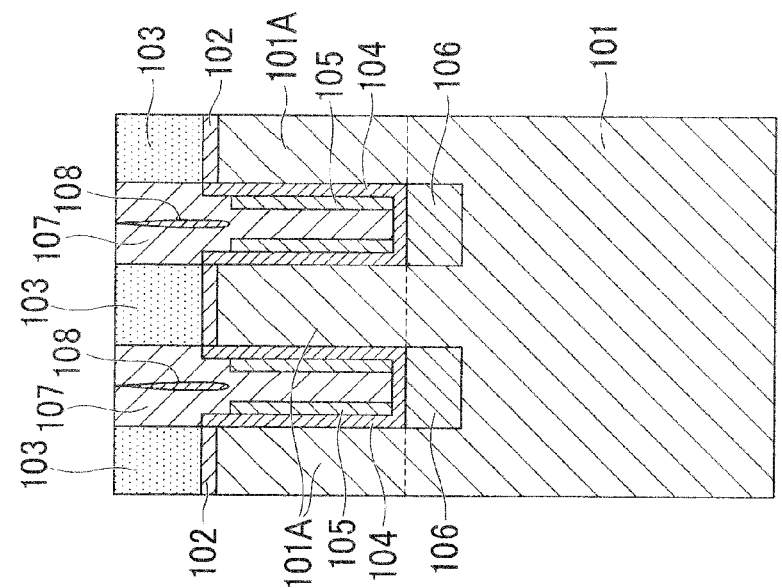
FIG. 19B is a fragmentary cross sectional elevation view, taken along an A-A' line of FIG. 19A, illustrating the same step as in FIG. 19A, involved in the method of forming the semiconductor device in accordance with the related art.
Figure 19C:
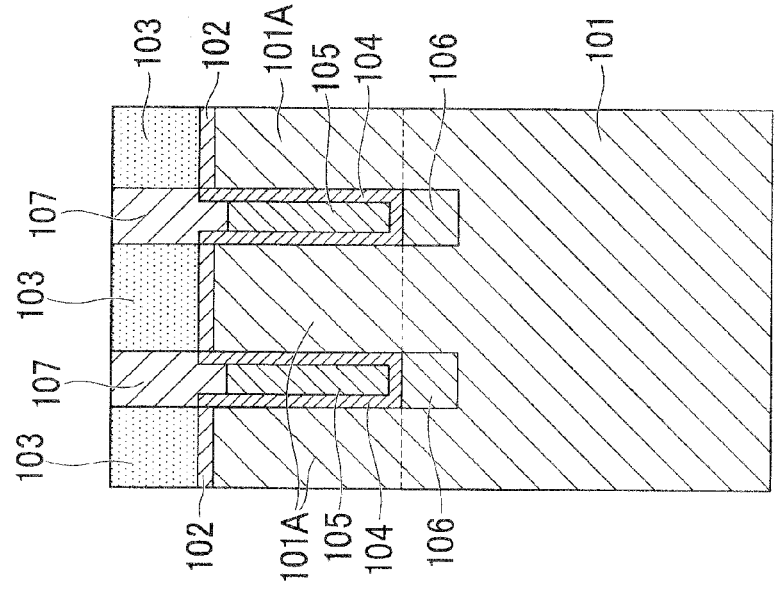
FIG. 19C is a fragmentary cross sectional elevation view, taken along a B-B' line of FIG. 19A, illustrating the same step as in FIG. 19A, involved in the method of forming the semiconductor device in accordance with the related art.
Figure 19A:
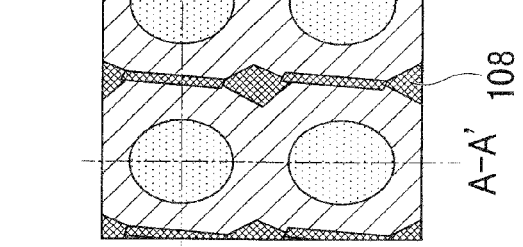
FIG. 19A is a fragmentary plan view illustrating a step subsequent to the step of FIGS. 18A, 18B and 18C, involved in the method of forming the semiconductor device in accordance with the related art.

With reference to FIGS. 19A, 19B and 19C, a first inter-layer insulator 107 is formed to fill the inter-space that extends around the pillars 10A with the hard masks 103. In some cases, the first inter-layer insulator 107 may be, but is not limited to, an oxide film. The first inter-layer insulator 107 can be formed as follows. A first insulating film can be formed entirely over the semiconductor substrate 101 by, but not limited to, a plasma enhanced chemical vapor deposition process, so that the inter-space that extends around the pillars 101A with the hard masks 103 is incompletely filled with the first insulating film. As shown in FIG. 19C, voids 108 are formed in the first insulating film that fills the inter-space that extends around the pillars 101A with the hard masks 103. The first insulating film is then polished by a chemical mechanical polishing process so that the surface of the hard masks 103 is shown, thereby forming the first inter-layer insulator 107. In some cases, the chemical mechanical polishing process can be carried out by, but not limited to, using the hard masks 103 of silicon nitride as a polishing stopper, and using ceria as a polishing agent. The surface of the first inter-layer insulator 107 is leveled to the surface of the hard masks 103, so that the surface of the first inter-layer insulator 107 and the surface of the hard masks 103 make up a planarized surface. The first inter-layer insulator 107 may not completely fill the inter-space that extends around the pillars 101A with the hard masks 103, while the voids 108 are formed in the first inter-layer insulator 107.

With reference to FIGS. 20A, 20B and 20C, the hard masks 103 of silicon nitride are removed from the top surface 11b of the pillars 10A. Removal process for removing the hard masks 103 of silicon nitride can be carried out by using, but not limited to, a hot phosphoric acid. The upper portion of the first inter-layer insulator 107 is positioned higher than the top surfaces 101b of the pillars 101A.

Second diffusion layers 115 are formed over the top surfaces 101b of the pillars 101A and under the silicon oxide film 102. The second diffusion layers 115 do not extend to the first inter-layer insulator 107 and to the gate insulating film 104. In some cases, the second diffusion layers 115 can be formed by, but not limited to, an ion-implantation process. Typically, the ion-implantation process can be carried out by introducing phosphorous ions into the upper portions of the pillars 101A at a dose of about 2.5E15 cm$^{-2}$, wherein the upper portions of the pillars 101A are positioned under the silicon oxide film 102. Typically but not limited to, the upper portions of the pillars 101A may be positioned directly under the silicon oxide film 102. The second diffusion layers 115 are positioned under the silicon oxide film 102. Typically but not limited to, the second diffusion layers 115 may be positioned directly under the silicon oxide film 102. The second diffusion layers 115 are lower in level than the top portions of the gate insulating films 104. Typically, the second diffusion layers 115 may have the bottom level that is similar in level to the top portions of the gate electrodes 105.

The silicon oxide film 102 is then removed from the semiconductor substrate 101, so that the second diffusion layers 115 are exposed. The top surfaces 101b of the pillars 101A are covered with the second diffusion layers 115. The second diffusion layers 115 have upper surfaces 115a that are positioned under openings of the first inter-layer insulator 107. The upper portions of the first inter-layer insulator 107 remain projected upwardly from the second diffusion layers 115. In some cases, removal for the silicon oxide film 102 can be carried out by, but not limited to, any know process such as a dry etching process.

Figure 21B:
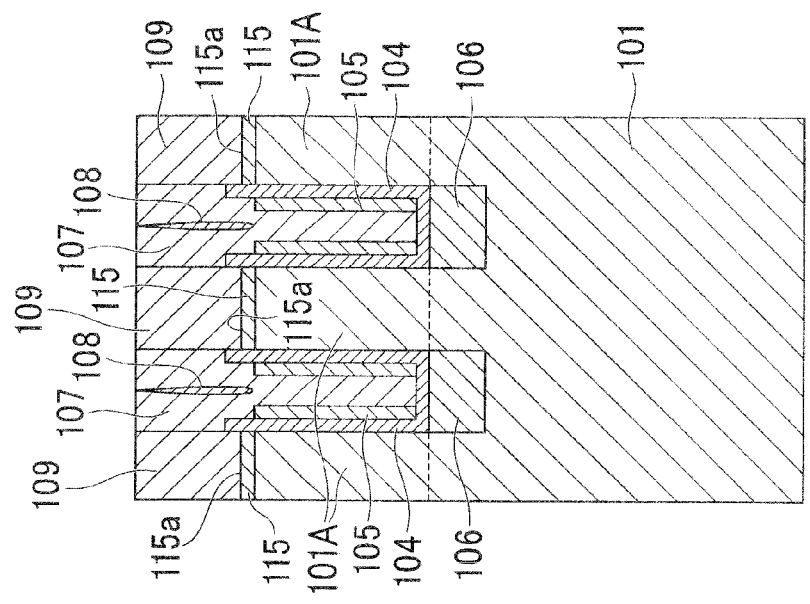
FIG. 21B is a fragmentary cross sectional elevation view, taken along an A-A line of FIG. 21A, illustrating the same step as in FIG. 21A, involved in the method of forming the semiconductor device in accordance with the related art.
Figure 21C:
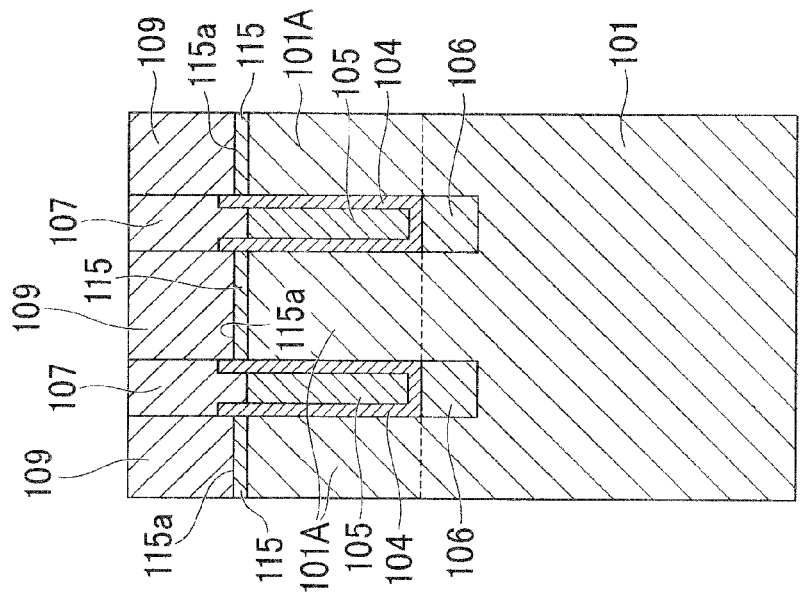
FIG. 21C is a fragmentary cross sectional elevation view, taken along a B-B' line of FIG. 21A, illustrating the same step as in FIG. 21A, involved in the method of forming the semiconductor device in accordance with the related art.
Figure 21A:
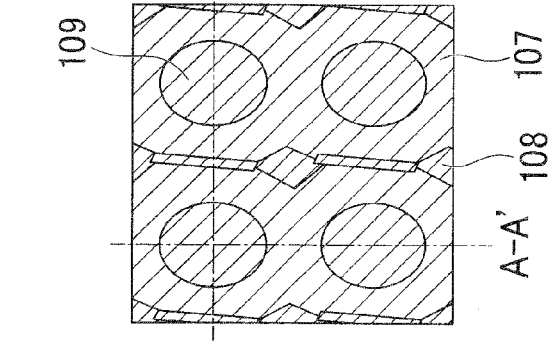
FIG. 21A is a fragmentary plan view illustrating a step subsequent to the step of FIGS. 20A, 20B and 20C, involved in the method of forming the semiconductor device in accordance with the related art.

With reference to FIGS. 21A, 21B and 21C, top electrodes 109 are formed on the upper surfaces 115a of the second diffusion layers 115, so that the top electrodes 109 fill up the openings of the first inter-layer insulator 107. The top electrodes 109 are in contact with the upper surfaces 115a of the second diffusion layers 115 and the first inter-layer insulator 107. In some cases, the top electrodes 109 can be made of one or more metals, The top electrodes 109 can be formed by, but not limited to, a known process. In some cases, the top electrodes 109 can be formed as follows. A titanium film is formed by a sputtering process over the semiconductor substrate 101, so that the titanium film covers the second diffusion layers 115. A barrier film is formed on the titanium film. In some cases, the barrier film may be, but is not limited to, a titanium nitride film. Typically, the titanium nitride film may be formed by, but not limited to, a chemical vapor deposition process. A tungsten film is formed entirely over the semiconductor substrate 101, so that the tungsten film covers the barrier film and the first inter-layer insulator 107. The tungsten film is then polished by a chemical mechanical polishing process until the top surface of the first inter-layer insulator 107 is exposed, thereby forming the top electrodes 109. The top electrodes 109 have the top surfaces that are similar in level to the top surface of the first inter-layer insulator 107.

In general, the top electrodes 109 are formed, while the voids of the first inter-layer insulator 107 are filled with the metal for the top electrodes 109. The metal filling up the voids of the first inter-layer insulator 107 may be connected to the gate electrodes 105 that are positioned closest to the void that is filled up with the metal. Namely, short circuits may be formed between the metal filling up the voids of the first inter-layer insulator 107 and the gate electrodes 105. Namely, the above-described method as the related to the art may form short circuits between the metal filling up the voids of the first inter-layer insulator 107 and the gate electrodes 105.

Another method of forming a semiconductor device including pillar transistors as the related art will be explained in detail, in order to facilitate the understanding of the present invention well. The other method as the related art can avoid formation of short circuit.

Process for forming a semiconductor device including an array of pillar transistors will be described with reference to the drawings of FIGS. 22A through 24C. The other method of the related art includes the same processes as described with reference to FIGS. 16A, 16B, and 16C through FIGS. 19A, 19B, and 19C, and the following processes to be described with reference to FIGS. 22A, 22B, and 22C through FIGS. 24A, 24B, and 24C.

The same processes as described with reference to FIGS. 16A, 16B, and 16C through FIGS. 19A, 19B, and 19C have been carried out to obtain the same structure as shown in FIGS. 19A, 19B, and 19C.

With reference to FIGS. 22A, 22B and 22C, side walls 151 are formed on the sided faces of the first inter-layer insulator 107, while the voids 108 in the first inter-layer insulator 107 are filled up with the insulating material for the side walls 151. The voids 108 once filled up with the insulating material for the side walls 151 are prevented from being filled up with any conductive material. Namely, the insulating material that fills up the voids 108 in the first inter-layer insulator 107 prevents the voids 108 from being filled up with any conductive material.

In some cases, the side walls 151 may be made of, but are not limited to, silicon nitride. A silicon nitride film is formed entirely over the semiconductor substrate 101, so that the silicon nitride film not only covers the oxide film 102 and the side surfaces and top surface of the first inter-layer insulator 107 but also fills up the voids 108 in the first inter-layer insulator 107. The silicon nitride film is etched back by a dry etching process, thereby forming side walls 151 of silicon nitride on the sided faces of the first inter-layer insulator 107. The voids 108 once filled up with silicon nitride are prevented from being filled up with any conductive material. Namely, silicon nitride that fills up the voids 108 in the first inter-layer insulator 107 prevents the voids 108 from being filled up with any conductive material.

With reference to FIGS. 23A, 23B and 23C, a second interlayer insulator 152 is formed over the semiconductor substrate 101, so that the second interlayer insulator 152 covers the silicon oxide film 102, and the first inter-layer insulator 107 with the side walls 151.

Figures 24B, 24C:
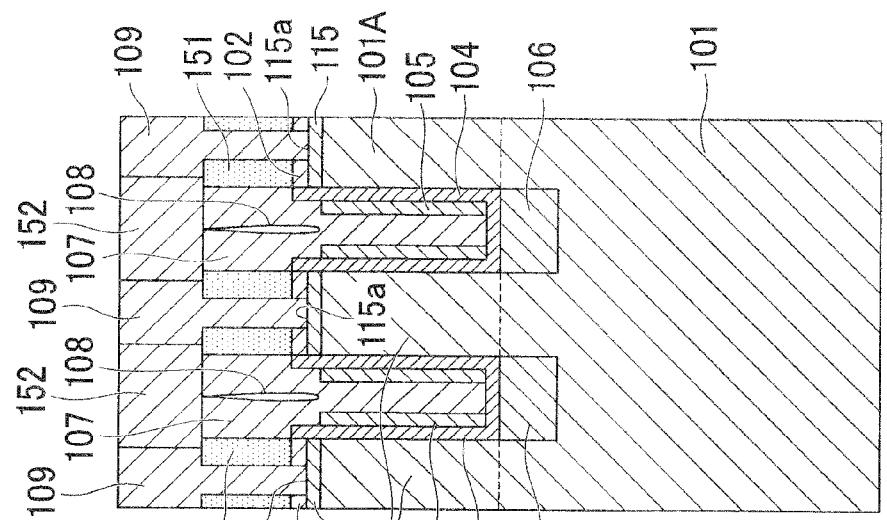
FIG. 24B is a fragmentary cross sectional elevation view, taken along an A-A' line of FIG. 24A, illustrating the same step as in FIG. 24A, involved in the other method of forming the semiconductor device in accordance with the related art.
FIG. 24C is a fragmentary cross sectional elevation view, taken along a B-B' line of FIG. 24A, illustrating the same step as in FIG. 24A, involved in the other method of forming the semiconductor device in accordance with the related art.
Figure 24A:
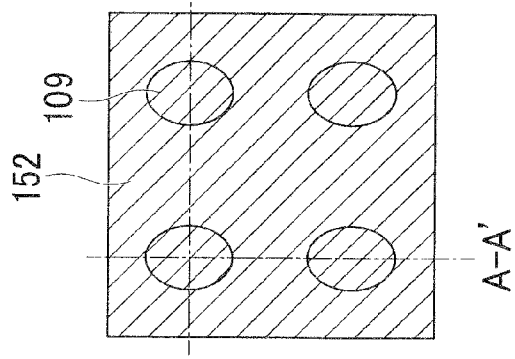
FIG. 24A is a fragmentary plan view illustrating a step subsequent to the step of FIGS. 23A, 23B and 23C, involved in the other method of forming the semiconductor device in accordance with the related art.

With reference to FIGS. 24A, 24B and 24C, contact holes are formed in the second interlayer insulator 152. The contact holes reach the side walls 151 and the upper surfaces 115a of the second diffusion layers 115. In some cases, the contact holes can be formed by a self align contact method. Self-aligned top electrodes 109 are formed in the contact holes, so that the top electrodes 109 fill up the contact holes of the second inter-layer insulator 152. The top electrodes 109 are in contact with the upper surfaces 115a of the second diffusion layers 115, the side walls 151 and the second interlayer insulator 152.

In general, the top electrodes 109 are formed, while the side walls 151 and the second interlayer insulator 152 separate the top electrodes 109 from the voids 108 already filled up with silicon nitride. Thus, any conductive material for the top electrodes 109 does not fill the voids 108 already filled up with silicon nitride. The insulating material filling up the voids 108 of the first inter-layer insulator 107 may provide no connection to the gate electrode 105 that is positioned closest to the void. Namely, no short circuits may be formed between the insulating material filling up the voids of the first inter-layer insulator 107 and the gate electrodes 105. Namely, the above-described method as the related to the art may avoid formation of short circuits between the voids of the first inter-layer insulator 107 and the gate electrodes 105.

The presence of the side walls 151 of silicon nitride reduces the contact area between the top electrodes 109 and the second diffusion layers 115. The reduction of the contact area between the top electrodes 109 and the second diffusion layers 115 increases the contact resistance between the top electrodes 109 and the second diffusion layers 115.

Japanese Unexamined Patent Applications, First Publications, Nos. 2005-303108 and 2005-303109 disclose a read only integrated circuit memory that include vertical MOS transistors with pillar structures and a DRAM memory cell using a pillar transistor.

The invention will be now described herein with reference to illustrative embodiments. Those skilled in the art will recognize that many alternative embodiments can be accomplished using the teaching of the present invention and that the invention is not limited to the embodiments illustrated for explanatory purpose.

First Embodiment

A semiconductor device including pillar transistors will be described with reference to the drawings of FIGS. 1A, 1B and 1C. A semiconductor device 10 may include a body of a pillar shape. The semiconductor device 10 may perform as a vertical MOS transistor. The body of a pillar shape will hereinafter be referred to as a pillar. The semiconductor device 10 may include a semiconductor substrate 1. The semiconductor substrate 1 may include, but is not limited to, a base 1a and pillars 1A. Each pillar 1A performs as a body of the transistor. The pillars 1A extend vertically from the base 1a. The pillars 1A are spatially separate from each other. In some cases, the semiconductor substrate 1 may be, but is not limited to, a silicon substrate 1. Each pillar 1A has a side surface 1b.

The semiconductor device 10 may further include gate insulating films 4. Each gate insulating film 4 covers the side surface 1b of the pillar 1A and the surface of the base 1a of the semiconductor substrate 1. The semiconductor device 10 may further include gate electrodes 5. Each gate electrode 5 covers the gate insulating film 4. Each gate electrode 5 surrounds the combined structure of the pillar 1A and the gate insulating film 4. The gate insulating film 4 separates the gate electrode 5 from the pillar 1A and from the base 1a.

The semiconductor device 10 may further include a first diffusion region 6 and a second diffusion region 12. The first diffusion region 6 is positioned in a shallow region of the base 1a of the semiconductor substrate 1, except under the pillars 1A. The first diffusion region 6 is positioned under the gate insulating film 4. The first diffusion region 6 is positioned at a lower level than the pillars 1A. The first diffusion region 6 does not extend under the pillars 1A. The first diffusion regions 6 perform as one of the source and drain regions of the transistor. The second diffusion regions 12 form the top surfaces 1c of the pillars 1A. Each second diffusion region 12 forms the top surface 1c of the pillar 1A. Each second diffusion region 12 is positioned at a higher level than the pillars 1A. Each second diffusion region 12 performs as another of the source and drain regions of the transistor. A channel region is formed in the pillar 1A. The channel region vertically extends between the first diffusion region 6 and each second diffusion region 12. The channel region vertically extends along the gate insulating film 4. The semiconductor device 10 may further include contact plugs 9. The contact plugs 9 are in contact with the second diffusion regions 12. Each contact plug 9 is in contact with the entire area of the top surface of the pillar 1A.

The semiconductor substrate 1 may include the base 1a and the pillars 1A. In some cases, the base 1a may have a planar surface. The pillars 1A may extend vertically from the planar surface of the base 1a. In some cases, each pillar 1 may have a pillar shape. Each pillar 1 has a generally elliptical shape in its cross sectional horizontal view. Each pillar 1 has a top surface 1c that has a generally elliptical shape. In some cases, the pillars 1A may be almost uniform in its height.

In some cases, the semiconductor substrate 1 may be, but is not limited to, a silicon substrate 1 which includes the silicon base 1a and the silicon pillars 1A. In other cases, the semiconductor substrate 1 may be, but is not limited to, a substrate that is covered with a silicon layer, wherein the silicon layer includes the silicon base 1a and the silicon pillars 1A.

In some cases, the gate insulating film 4 may be, but is not limited to, a silicon oxide film 4 which covers the side surface 1b of the pillar 1A. In some cases, the gate electrode 5 may be, but is not limited to, a polysilicon film that is doped with an impurity such as phosphorous. The gate electrode 5 is in contact with the gate insulating film 4. The gate electrode 5 covers the gate insulating film 4 that further covers the side surface 1b of the pillar 1A.

In some cases, the first diffusion region 6 may be, but is not limited to, a diffusion region that contains a dopant, wherein the dopant can be ion-implanted into the diffusion region. The first diffusion region 6 is disposed in the base 1a of the semiconductor substrate 1. In some cases, the first diffusion region 6 may have a concentration of phosphorus, but is not limited to, about $1E15$ cm$^{-3}$.

In some cases, each second diffusion region 12 may be, but is not limited to, a diffusion region that contains a dopant, wherein the dopant can be ion-implanted into the diffusion region. Each second diffusion region 12 forms the top surface 1c of the pillar 1A. In some cases, each second diffusion region 12 may have a concentration of phosphorus, but is not limited to, about $2.5E15$ cm$^{-3}$.

Each contact plug 9 is in contact with the entire surface 1c of the second diffusion region 12 that forms the top surface 1c of the pillar 1A. Each contact plug 9 is in contact with the entire surface 1c of the pillar 1A. Each contact plug 9 may have a multi-layered structure, but not limited thereto. In some cases, each contact plug 9 may include three layers, such as a titanium layer (Ti), a titanium nitride layer (TiN), and a tungsten layer (W). The titanium layer (Ti) is in contact with the entire surface 1c of the second diffusion region 12. The titanium nitride layer (TiN) is disposed on the titanium layer (Ti). The tungsten layer (W) is disposed on the titanium nitride layer (TiN). Each contact plug 9 has a bottom face 9a. In some cases, but not essentially and rather optionally, the center position of the bottom face 9a of each contact plug 9 may be aligned to the center position of the top surface 1c of the pillar 1A. The diameter of the bottom surface 9a of the contact plug 9 is same as the diameter of the top surface 1c of the pillar 1A. Each contact plug 9 has a top face 9b. In some cases, the top face 9b has a generally elliptical shape. The top face 9b of each contact plug 9 may be slightly larger than the bottom face 9a thereof.

Each contact plug 9 is in contact with the entire area of the top surface of the pillar 1A. This structure ensures an increased contact area between each second diffusion region 12 and each contact plug 9 as compared to the structures. The increase of the contact area between each second diffusion region 12 and each contact plug 9 decreases the contact resistance between each second diffusion region 12 and each contact plug 9.

The center position of the bottom face 9a of each contact plug 9 may be aligned to the center position of the top surface 1c of the pillar 1A. The diameter of the bottom surface 9a of the contact plug 9 may be same as the diameter of the top surface 1c of the pillar 1A. This structure can prevent that each contact plug 9 from extending outside the top surface 1c of the pillar 1A. This structure can prevent that each contact plug 9 from contacting the gate electrode 5, thereby preventing a short circuit from being formed between the contact plug 9 and the gate electrode 5.

The semiconductor device 10 may further include a first inter-layer insulator 7. The first inter-layer insulator 7 fills the inter-space that extends around the pillars 1A and the contact plugs 9. The inter-space is defined by the gate electrodes 5 and the gate insulating films 4 that surround the pillars 1A and by the contact plugs 9. The top surface of the first inter-layer insulator 7 is higher in level than the top surfaces 1c of the pillars 1A. The top surface of the first inter-layer insulator 7 is higher in level than the second diffusion region 12 that forms the top surface 1c of the pillar 1A. The top surface of the first inter-layer insulator 7 is lower in level than the top surfaces of the contact plugs 9. The first inter-layer insulator 7 is in contact with the gate electrodes 5 and the gate insulating films 4 as well as contact the contact plugs 9. In some cases, the first inter-layer insulator 7 may be, but is not limited to, a silicon nitride film.

The semiconductor device 10 may further include a second inter-layer insulator 11. The second inter-layer insulator 11 is disposed on the top surface of the first inter-layer insulator 7. The second inter-layer insulator 11 fills the inter-space that extends around the contact plugs 9. The inter-space is defined by the contact plugs 9 and the top surface of the first inter-layer insulator 7. In some cases, the second inter-layer insulator 11 may be, but is not limited to, a silicon oxide film. In some cases, the first and second inter-layer insulators 7 and 11 may be made of different insulating materials that are different in etching rate from each other.

As shown in FIG. 1C, the first inter-layer insulator 7 may have voids 8. The voids 8 in the first inter-layer insulator 7 are filled up with the insulating material for the second inter-layer insulator 11. If the second inter-layer insulator 11 is made of silicon oxide, then the voids 8 in the first inter-layer insulator 7 are filled up with silicon oxide. The voids 8 once filled up with the insulating material for the second inter-layer insulator 11 are prevented from being filled up with any conductive material Namely, the insulating material that fills up the voids 8 in the first inter-layer insulator 7 prevents the voids 8 from being filled up with any conductive material. Thus, any conductive material for the contact plugs 9 does not fill the voids 8 already filled up with the insulating material for the second inter-layer insulator 11. The insulating material filling up the voids 8 of the first inter-layer insulator 7 may provide no connection to the gate electrode 5 that is positioned closest to the void. Namely, no short circuits may be formed between the insulating material filling up the voids 8 of the first inter-layer insulator 7 and the gate electrodes 5. This may avoid formation of short circuits between the voids 8 of the first inter-layer insulator 7 and the gate electrodes 5.

Each contact plug 9 is in contact with the entire area of the top surface of the pillar 1A. This ensures the largest possible contact area between the contact plugs 9 and the second diffusion layers 12. Ensuring the largest possible contact area between the contact plugs 9 and the second diffusion layers 12 ensures the smallest possible contact resistance between the contact plugs 9 and the second diffusion layers 12.

A method of forming above-described semiconductor device 10 may include, but is not limited to, a hard mask formation process, a pillar formation process, a gate insulating film formation process, a gate electrode formation process, a first diffusion region formation process, a first inter-layer insulator formation process, a second inter-layer insulator formation process, a contact hole formation process, a second diffusion region formation process, and a contact plug formation process.

The hard mask formation process may be, but is not limited to, a process for forming a hard mask over a semiconductor substrate, wherein the hard mask may be made of the same material as the second inter-layer insulator.

The pillar formation process may be, but is not limited to, a process for forming pillars and a base from the semiconductor substrate by using the hard mask.

The gate insulating film formation process may be, but is not limited to, a process for forming gate insulating films on side surfaces of the pillars.

The gate electrode formation process may be, but is not limited to, a process for forming gate electrodes on the gate insulating films that have been formed on the side surfaces of the pillars. The combination of the gate electrode and the gate insulating film surrounds the side surface of each pillar.

The first diffusion region formation process may be, but is not limited to, a process for selectively forming a first diffusion region in a shallow region, except under the pillars, of the base of the semiconductor substrate. The first diffusion region does not extend to under the pillars.

The first inter-layer insulator formation process may be, but is not limited to, a process for filling the first inter-layer insulator into inter-spaces among the pillars combined with the hard masks, and a subsequent process for planarize the first inter-layer insulator.

The second inter-layer insulator formation process may be, but is not limited to, a process for forming a second inter-layer insulator over the hard mask and the first inter-layer insulator.

The contact hole formation process may be, but is not limited to, a process for forming contact holes after the hard mask is removed.

The second diffusion region formation process may be, but is not limited to, a process for forming second diffusion regions at the upper portions of the pillars.

The contact plug formation process may be, but is not limited to, a process for forming contact plugs in the contact holes.

The processes for forming the semiconductor device including pillar transistors will be described in details with reference to the drawings of FIGS. 2A, 2B, 2C through FIGS. 7A, 7B, 7C.

(Hard Mask Formation Process)

The hard mask formation process will be described for forming a hard mask 3 over a semiconductor substrate 1, wherein the hard mask 3 may be made of the same material as a second inter-layer insulator 11.

Figure 2C:
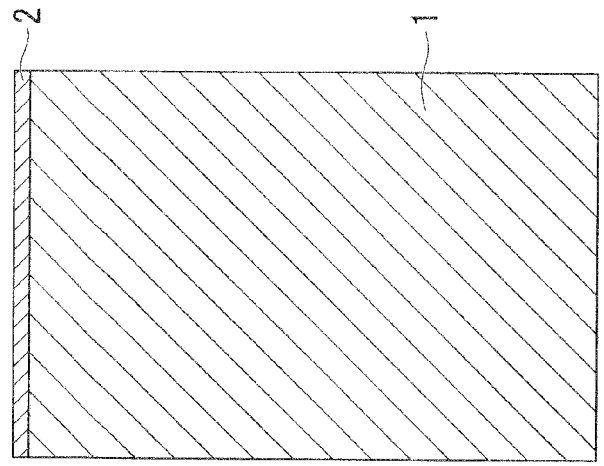
FIG. 2C is a fragmentary cross sectional elevation view, taken along a B-B' line of FIG. 2A, illustrating step involved in a method of forming the semiconductor device including pillar transistors in accordance with the first preferred embodiment of the present invention.
Figure 2B:
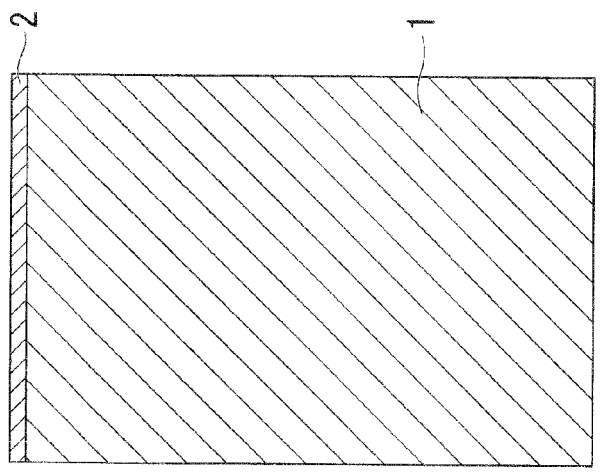
FIG. 2B is a fragmentary cross sectional elevation view, taken along an A-A' line of FIG. 2A, illustrating the step involved in a method of forming the semiconductor device including pillar transistors in accordance with the first preferred embodiment of the present invention.
Figure 2A:
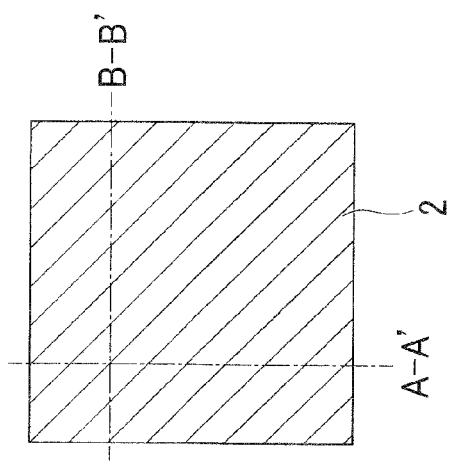
FIG. 2A is a fragmentary plan view illustrating a step involved in a method of forming the semiconductor device including pillar transistors shown in FIGS. 1A, 1B, and 1C, in accordance with the first preferred embodiment of the present invention.

With reference to FIGS. 2A, 2B and 2C, a semiconductor substrate 1 such as a silicon substrate 1 is prepared. A thermal oxidation process is carried out to form an oxide film 2 such as a silicon oxide film 2 on a surface of the semiconductor substrate 1. In some cases, the thermal oxidation process can be carried out at a temperature of about 850° C. for 10 minutes.

With reference to FIGS. 3A, 3B and 3C, a silicon oxide film is formed over the oxide film 2 such as the silicon oxide film 2. In some cases, the thickness of the silicon oxide film may be, but is not limited to, 100 nanometers. In some cases, the silicon oxide film can be formed by a chemical vapor deposition process. A lithography process and a dry etching process are carried out to pattern the silicon oxide film, thereby forming hard masks 3 of silicon oxide on the oxide film 2 such as the silicon oxide film 2. In some cases, the hard masks 3 may each have, but not limited to, an elliptical shape in plan view as shown in FIG. 3A, wherein the ellipse of the hard masks 3 of silicon oxide has a semi-major axis that is parallel to the A-A' line of FIG. 3A, and a semi-minor axis that is parallel to the B-B' line of FIG. 3A.

(Pillar Formation Process)

The pillar formation process will be described in details for forming pillars 1A and a base 1a from the semiconductor substrate 1 by using the hard mask 3.

With reference again to FIGS. 3A, 3B and 3C, a dry etching process is carried out using the hard masks 3 of silicon oxide to selectively and anisotropically etch the oxide film 2 and the semiconductor substrate 1, thereby forming a plurality of pillars under the hard masks 3 of silicon oxide. The plurality of pillars 1A of semiconductor or silicon is a part of the semiconductor substrate 1. In other words, the semiconductor substrate 1 includes the plurality of pillars 1A and a base portion 1a. The plurality of pillars 1A extends vertically from the base portion 1a of the semiconductor substrate 1 as shown in FIGS. 3B and 3C. The plurality of pillars 1A extends vertically from the semiconductor substrate 1. Each pillar 1A has a side surface 1b.

(Gate Insulating Film Formation Process)

The gate insulating film formation process will be described in details for forming gate insulating films 4 on the side surfaces 1b of the pillars 1A.

Figures 4B, 4C:
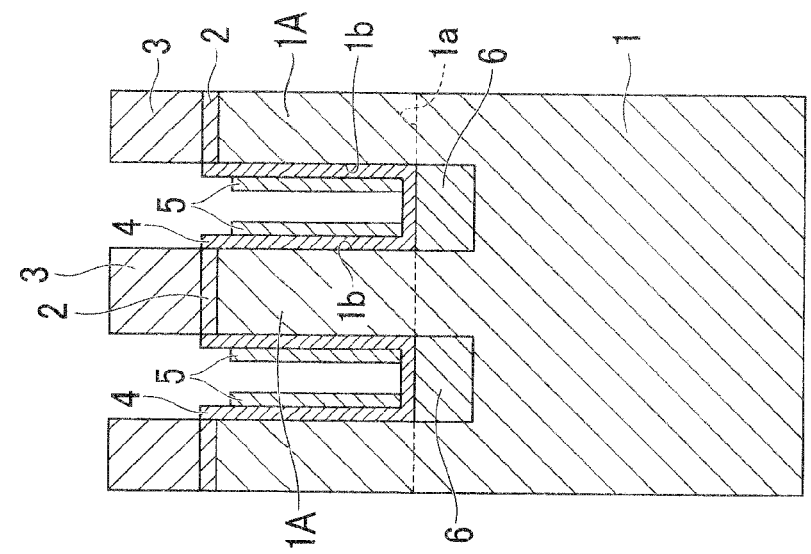
FIG. 4B is a fragmentary cross sectional elevation view, taken along an A-A' line of FIG. 4A, illustrating the step, subsequent to the step of FIGS. 3A, 3B, and 3C, involved in a method of forming the semiconductor device including pillar transistors in accordance with the first preferred embodiment of the present invention.
FIG. 4C is a fragmentary cross sectional elevation view, taken along a B-B' line of FIG. 4A, illustrating step, subsequent to the step of FIGS. 3A, 3B, and 3C, involved in a method of forming the semiconductor device including pillar transistors in accordance with the first preferred embodiment of the present invention.
Figure 4A:
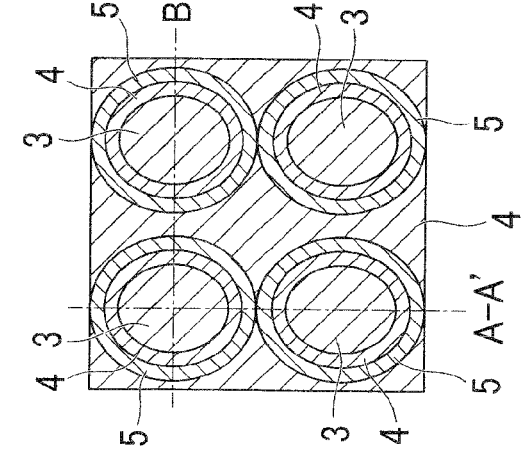
FIG. 4A is a fragmentary plan view illustrating a step, subsequent to the step of FIGS. 3A, 3B, and 3C, involved in a method of forming the semiconductor device including pillar transistors shown in FIGS. 1A, 1B, and 1C, in accordance with the first preferred embodiment of the present invention.

With reference to FIGS. 4A, 4B and 4C, a gate insulating film 4 such as a gate oxide film 4 is formed on the surfaces of the semiconductor substrate 1. Namely, the gate insulating film 4 is formed on the side surfaces 1b of the plurality of pillars 1A and the surface of the semiconductor substrate 1. The gate insulating film 4 extends along the side surfaces 1b of the plurality of pillars 1A and the surface of the semiconductor substrate 1. The gate oxide film 4 surrounds each of the plurality of pillars 1A. The gate oxide film 4 can be formed by, but not limited to, a thermal oxidation process. In some cases, the thermal oxidation process can be carried out at a temperature of about 1000° C. for one minute. The plurality of pillars 1A that are each surrounded by the gate oxide film 4 defines an inter-space. The inter-space is defined by the surface of the semiconductor substrate 1 and by the gate oxide film 4 extending along the side surfaces 1b of the plurality of pillars 1A. In other words, the inter-space is a space that extends outside the plurality of pillars 1A.

(Gate Electrode Formation Process)

The gate electrode formation process will be described in details for forming gate electrodes 5 on the gate insulating films 4 that have been formed on the side surfaces 1b of the pillars 1A. The combination of the gate electrode 5 and the gate insulating film 4 surrounds the side surface 1b of each pillar 1A.

With reference again to FIGS. 4A, 4B and 4C, a plurality of gate electrodes 5 is formed on the gate oxide film 4 that surrounds each of the plurality of pillars 1A. Each gate electrode 5 is in contact with a part of the gate oxide film 4, wherein the part of the gate oxide film 4 is in contact with the side surface 1b of the pillar 1A. Each gate electrode 5 surrounds the pillar 1A and a part of the gate oxide film 4, wherein the part of the gate oxide film 4 is in contact with the side surface 1b of the pillar 1A. Each pillar 1A is surrounded by the gate oxide film 4 and the gate electrode 5. As shown in FIGS. 4A and 4B, first pair of two adjacent gate electrodes 5 are in contact with each other. The first pair of two adjacent gate electrodes 5 surround first pair of two adjacent pillars 1A that are aligned on the semi-major axis, wherein the first pair of two adjacent gate electrodes 5 are in contact with each other at a contact point in plan view that is positioned on the semi-major axis. As shown in FIGS. 4A and 4C, second pair of two adjacent gate electrodes 5 are separate from each other. The second pair of two adjacent gate electrodes 5 surrounds second pair of two adjacent pillars 1A that are aligned on the semi-minor axis, wherein the second pair of two adjacent gate electrodes 5 separate each other.

In some cases, the thickness of each gate electrode 5 may be so thick that the first pair of two adjacent gate electrodes 5 are in contact with each other at a contact point in plan view that is positioned on the semi-major axis as shown in FIGS. 4A and 4B, while the second pair of two adjacent gate electrodes 5 are separate from each other as shown in FIGS. 4A and 4C. No spatial gap is present between the first pair of two adjacent gate electrodes 5 that are aligned on the semi-major axis parallel to the A-A' line of FIGS. 4A and 4B. A spatial gap is present between the second pair of two adjacent gate electrodes 5 that are aligned on the semi-minor axis parallel to the B-B' line of FIGS. 4A and 4C.

In some cases, the gate electrodes 5 may be made of, but not limited to, a polysilicon that contains an impurity. Typically, the gate electrodes 5 may be made of, but not limited to, an in-situ phosphorus-doped polysilicon. In this case, the gate electrodes 5 can be formed by follows. An in-situ phosphorus-doped polysilicon film is formed entirely over the semiconductor substrate 1 by a chemical vapor deposition process. The in-situ phosphorus-doped polysilicon film is formed on the gate oxide film 4 and on the hard masks 3 of silicon oxide. A dry etching process can be carried out to etch back the in-situ phosphorus-doped polysilicon film, thereby forming the gate electrodes 5. Each gate electrode 5 is in contact with a part of the gate oxide film 4, wherein the part of the gate oxide film 4 is in contact with the side surface 1b of the pillar 1A. Each gate electrode 5 surrounds the pillar 1A and a part of the gate oxide film 4, wherein the part of the gate oxide film 4 is in contact with the side surface 1b of the pillar 1A.

(First Diffusion Region Formation Process)

The first diffusion region formation process will be described in details for selectively forming a first diffusion region 6 in a shallow region, except under the pillars 1A, of the base 1a of the semiconductor substrate 1. The first diffusion region 6 does not extend to under the pillars 1A. The first diffusion region 6 may perform as one of the source and drain regions.

With reference again to FIGS. 4A, 4B and 4C, a first diffusion layer 6 is selectively formed in shallow regions of the semiconductor substrate 1. The part of the gate insulating film 4 extends over the surface of the semiconductor substrate 1. The shallow regions extend under the surface of the semiconductor substrate 1. The first diffusion layer 6 is positioned under the part of the gate insulating film 4, wherein the part of the gate insulating film 4 extends over the surface of the semiconductor substrate 1. The first diffusion layer 6 does not extend under the pillars 1A. The first diffusion layer 6 extends within the shallow region of the semiconductor substrate 1, except under the pillars 1A that extend upwardly from the semiconductor substrate 1. In some cases, the first diffusion layer 6 may contain, but not limited to, phosphorous. Typically, the first diffusion layer 6 can be formed by, but not limited to, a selective ion-implantation process. The selective ion-implantation process can be carried out by introducing phosphorous ions into the semiconductor substrate 1, except under the pillars 1A. The dose of the ion-implantation may be, but is not limited to, about $1E15\ cm^{-2}$.

(First Inter-Layer Insulator Formation Process)

The first inter-layer insulator formation process will be described in details for filling the first inter-layer insulator 7 into inter-spaces among the pillars 1A combined with the hard masks 3, and a subsequent process for planarize the first inter-layer insulator 7.

With reference to FIGS. 5A, 5B and 5C, a first inter-layer insulator 7 is formed to fill the inter-space that extends around the pillars 1A with the hard masks 3 of silicon oxide. In some cases, the first inter-layer insulator 7 may be, but is not limited to, an oxide film. The first inter-layer insulator 7 can be formed as follows. A first insulating film can be formed entirely over the semiconductor substrate 1 and the hard masks 3 of silicon oxide. The first insulating film may be made of silicon nitride. The first insulating film of silicon nitride can be formed by, but not limited to, a plasma chemical vapor deposition process. The inter-space that extends around the pillars 1A with the hard masks 3 of silicon oxide is incompletely filled with the first insulating film of silicon nitride, so that as shown in FIG. 5C, voids 8 are formed in the first insulating film that fills the inter-space that extends around the pillars 1A with the hard masks 3. The first insulating film of silicon nitride is then polished by a chemical mechanical polishing process so that the surface of the hard masks 3 is shown, thereby forming the first inter-layer insulator 7 of silicon nitride. In some cases, the chemical mechanical polishing process can be carried out by, but not limited to, using the hard masks 3 of silicon oxide as a polishing stopper, and using silica as a polishing agent. The surface of the first inter-layer insulator 7 of silicon nitride is leveled to the surface of the hard masks 3 of silicon oxide, so that the surface of the first inter-layer insulator 7 of silicon nitride and the surface of the hard masks 3 of silicon oxide make up a planarized surface. The first inter-layer insulator 7 of silicon nitride may not completely fill the inter-space that extends around the pillars 1A with the hard masks 3 of silicon oxide, while the voids 8 are formed in the first inter-layer insulator 7 of silicon nitride.

(Second Inter-Layer Insulator Formation Process)

The second inter-layer insulator formation process will be described in details for forming a second inter-layer insulator 11 over the hard mask 3 of silicon oxide and over the first inter-layer insulator 7 of silicon nitride.

With reference to FIGS. 6A, 6B and 6C, a second inter-layer insulator 11 of silicon oxide is formed over the hard mask 3 of silicon oxide and over the first inter-layer insulator 7 of silicon nitride, while the voids 8 in the first inter-layer insulator 7 are filled up with silicon oxide.

(Contact Hole Formation Process)

The contact hole formation process will be described in details for forming contact holes after the hard mask 3 is removed.

With reference to FIGS. 7A, 7B and 7C, contact holes can be formed by patterning the second inter-layer insulator 11 of silicon oxide and removal of the hard mask 3 of silicon oxide, while using the first inter-layer insulator 7 of silicon nitride as an etching stopper. Both the second inter-layer insulator 11 and the hard mask 3 are made of the same insulating material, for example, silicon oxide. The second inter-layer insulator 11 of silicon oxide is selectively removed so that the second inter-layer insulator 11 of silicon oxide remains over the first inter-layer insulator 7 of silicon nitride. The hard mask 3 of silicon oxide is entirely removed, so that the entire top surfaces 1c of the pillars 1A are shown. The contact holes are self-aligned to the entire top surfaces 1c of the pillars 1A. The patterning process for patterning the second inter-layer insulator 11 of silicon oxide can be carried out by a lithography process and a dry etching process. The second inter-layer insulator 11 of silicon oxide is patterned so that the pattern of the second inter-layer insulator 11 is positioned over the first inter-layer insulator 7 of silicon nitride. The pattern of the second inter-layer insulator 11 does not extend outside the first inter-layer insulator 7 of silicon nitride. The pattern of the second inter-layer insulator 11 has side edges that may be positioned inside the side edges of the first inter-layer insulator 7 of silicon nitride.

An anisotropic etching process can be carried out under conditions that the etching rate of silicon oxide is higher than the etching rate of silicon nitride. In other words, the anisotropic etching process can be carried out under conditions that silicon oxide is etched, while silicon nitride is not substantially etched. Carrying out the anisotropic etching process under such conditions of the anisotropic etching process allow the first inter-layer insulator 7 of silicon nitride to perform as an etching stopper. Typically, the anisotropic etching process may be a dry etching process. The anisotropic etching process is carried out using the first inter-layer insulator 7 of silicon nitride as an etching stopper. The second inter-layer insulator 11 of silicon oxide is selectively etched to as to form the pattern of the second inter-layer insulator 11 and also remove the hard mask 3 of silicon oxide. The pattern of the second inter-layer insulator 11 is positioned over the first inter-layer insulator 7 of silicon nitride. The pattern of the second inter-layer insulator 11 does not extend outside the first inter-layer insulator 7 of silicon nitride. The hard mask 3 of silicon oxide is removed so that the side surfaces of the upper portion of the first inter-layer insulator 7 of silicon nitride are exposed to the contact holes, and that the entire top surfaces 1c of the pillars 1A are exposed to the contact holes. Each contact hole is defined by the entire top surfaces 1c of the pillars 1A and the side surfaces of the upper portion of the first inter-layer insulator 7 of silicon nitride. Each contact hole is self-aligned to the entire top surfaces 1c of the pillars 1A.

(Second Diffusion Region Formation Process)

The second diffusion region formation process will be described in details for forming second diffusion regions 12 on the entire top surfaces 1c of the pillars 1A.

With reference again to FIGS. 7A, 7B and 7C, second diffusion layers 12 are formed over the top surfaces 1c of the pillars 1A. The second diffusion layers 12 do not extend to the first inter-layer insulator 7 and to the gate insulating film 4. The second diffusion layers 12 can be formed by, but not limited to, an ion-implantation process. Typically, the ion-implantation process can be carried out by introducing phosphorous ions into the upper portions of the pillars 1A at a dose of about $2.5E15\ cm^{-2}$, wherein the upper portions of the pillars 1A are positioned under the contact holes. Typically but not limited to, the upper portions of the pillars 1A may be positioned directly under the contact holes. The second diffusion layers 12 are positioned under the contact holes. Typically but not limited to, the second diffusion layers 12 may be positioned directly under the contact holes. The second diffusion layers 12 are lower in level than the top portions of the gate insulating films 4. Typically, the second diffusion layers 12 may have the bottom level that is similar in level to the top portions of the gate electrodes 5.

(Contact Plug Formation Process)

The contact plug formation process will be described in details for forming contact plugs 9 in the contact holes.

With reference again to FIGS. 7A, 7B and 7C, contact plugs 9 are formed on the second diffusion layers 12, so that the contact plugs 9 fill up the openings of the contact holes. The contact plugs 9 are in contact with the second diffusion layers 12 and the side surfaces of the upper portion of the first inter-layer insulator 107. In some cases, the contact plugs 9 can be made of one or more metals. The contact plugs 9 can be formed by, but not limited to, a known process. In some cases, the contact plugs 9 can be formed as follows. A titanium film is formed on inside walls of the contact holes by a sputtering process, so that the inside walls of the contact holes are covered by the titanium film. A barrier film is formed on the titanium film. In some cases, the barrier film may be, but is not limited to, a titanium nitride film. Typically, the titanium nitride film may be formed by, but not limited to, a chemical vapor deposition process. A tungsten film is formed entirely over the semiconductor substrate 1, so that the tungsten film covers the barrier film and the second inter-layer insulator 11. The tungsten film is then polished by a chemical mechanical polishing process until the top surface of the second inter-layer insulator 11 is exposed thereby forming the contact plugs 9. The contact plugs 9 have the top surfaces that are similar in level to the top surface of the second inter-layer insulator 11. As a result, a semiconductor device has been completed as shown in FIGS. 7A, 7B and 7C.

With reference again to FIGS. 8A, 8B and 8C, a phase change material 13 is formed over the second inter-layer insulator 11 and the contact plugs 9. Bit lines 14 are formed over the phase change material 13. A passivation film 15 is formed over the bit lines 14, the phase change material 13 and the second inter-layer insulator 11. As a result, a phase change memory can be formed from the semiconductor device 10.

Each contact plug 9 is in contact with the entire area of the top surface of the pillar 1A. This structure shown in FIGS. 7A, 7B, 7C, 8A, 8B, and 8C ensures an increased contact area between each second diffusion region 12 and each contact plug 9 as compared to the structures shown in FIGS. 24A, 24B and 24C. The increase of the contact area between each second diffusion region 12 and each contact plug 9 decreases the contact resistance between each second diffusion region 12 and each contact plug 9.

As described above, the center position of the bottom face 9a of each contact plug 9 may be aligned to the center position of the top surface 1c of the pillar 1A and the diameter of the bottom surface 9a of the contact plug 9 may be the same as the diameter of the top surface 1c of the pillar 1A as shown in FIGS. 7A, 7B, 7C, 8A, 8B, and 8C. This structure shown in FIGS. 7A, 7B, 7C, 8A, 8B, and 8C can prevent that each contact plug 9 from extending outside the top surface 1c of the pillar 1A as shown in FIGS. 7A, 7B, 7C, 8A, 8B, and 8C. This structure can prevent that each contact plug 9 from contacting the gate electrode 5, thereby preventing a short circuit from being formed between the contact plug 9 and the gate electrode 5.

As described above, if the second inter-layer insulator 11 is made of silicon oxide, then the voids 8 in the first inter-layer insulator 7 are filled up with silicon oxide as shown in FIGS. 7A, 7B, 7C, 8A, 8B, and 8C. The voids 8 once filled up with the insulating material for the second inter-layer insulator 11 are prevented from being filled up with any conductive material. Namely, the insulating material that fills up the voids 8 in the first inter-layer insulator 7 prevents the voids 8 from being filled up with any conductive material. Thus, any conductive material for the contact plugs 9 does not fill the voids 8 already filled up with the insulating material for the second inter-layer insulator 11. The insulating material filling up the voids 8 of the first inter-layer insulator 7 may provide no connection to the gate electrode 5 that is positioned closest to the void. Namely, no short circuits may be formed between the insulating material filling up the voids 8 of the first inter-layer insulator 7 and the gate electrodes 5. This may avoid formation of short circuits between the voids 8 of the first inter-layer insulator 7 and the gate electrodes 5.

As described above, the contact holes can be formed by patterning the second inter-layer insulator 11 of silicon oxide and removal of the hard mask 3 of silicon oxide, while using the first inter-layer insulator 7 of silicon nitride as an etching stopper. Both the second inter-layer insulator 11 and the hard mask 3 are made of the same insulating material, for example, silicon oxide. The second inter-layer insulator 11 of silicon oxide is selectively removed so that the second inter-layer insulator 11 of silicon oxide remains over the first inter-layer insulator 7 of silicon nitride. The hard mask 3 of silicon oxide is entirely removed, so that the entire top surfaces 1c of the pillars 1A are shown. The contact holes are self-aligned to the entire top surfaces 1c of the pillars 1A. The second inter-layer insulator 11 of silicon oxide is patterned so that the pattern of the second inter-layer insulator 11 is positioned over the first inter-layer insulator 7 of silicon nitride. The pattern of the second inter-layer insulator 11 does not extend outside the first inter-layer insulator 7 of silicon nitride. The pattern of the second inter-layer insulator 11 has side edges that may be positioned inside the side edges of the first inter-layer insulator 7 of silicon nitride. The center position of the bottom face 9a of each contact plug 9 is then self-aligned to the center position of the top surface 1c of the pillar 1A and the diameter of the bottom surface 9a of the contact plug 9 may be the same as the diameter of the top surface 1c of the pillar 1A as shown in FIGS. 7A, 7B, 7C, 8A, 8B, and 8C. This process can prevent that each contact plug 9 from extending outside the top surface 1c of the pillar 1A as shown in FIGS. 7A, 7B, 7C, 8A, 8B, and 8C. This process can prevent that each contact plug 9 from contacting the gate electrode 5, thereby preventing a short circuit from being formed between the contact plug 9 and the gate electrode 5.

As described above, the anisotropic etching process can be carried out under conditions that the etching rate of silicon oxide is higher than the etching rate of silicon nitride. In other words, the anisotropic etching process can be carried out under conditions that silicon oxide is etched, while silicon nitride is not substantially etched. Carrying out the anisotropic etching process under such conditions of the anisotropic etching process allow the first inter-layer insulator 7 of silicon nitride to perform as an etching stopper. The anisotropic etching process is carried out using the first inter-layer insulator 7 of silicon nitride as an etching stopper. The second inter-layer insulator 11 of silicon oxide is selectively etched to as to form the pattern of the second inter-layer insulator 11 and also remove the hard mask 3 of silicon oxide. The pattern of the second inter-layer insulator 11 is positioned over the first inter-layer insulator 7 of silicon nitride. The pattern of the second inter-layer insulator 11 does not extend outside the first inter-layer insulator 7 of silicon nitride. The hard mask 3 of silicon oxide is removed so that the side surfaces of the upper portion of the first inter-layer insulator 7 of silicon nitride are exposed to the contact holes, and that the entire top surfaces 1c of the pillars 1A are exposed to the contact holes. Each contact hole is self-aligned to the entire top surfaces 1c of the pillars 1A. The center position of the bottom face 9a of each contact plug 9 is then self-aligned to the center position of the top surface 1c of the pillar 1A and the diameter of the bottom surface 9a of the contact plug 9 may be the same as the diameter of the top surface 1c of the pillar 1A as shown in FIGS. 7A, 7B, 7C, 8A, 8B, and 8C. This process can prevent that each contact plug 9 from extending outside the top surface 1c of the pillar 1A as show in FIGS. 7A, 7B, 7C, 8A, 8B, and 8C. This process can prevent that each contact plug 9 from contacting the gate electrode 5, thereby preventing a short circuit from being formed between the contact plug 9 and the gate electrode 5. Further, each contact plug 9 is in contact with the entire area of the top surface of the pillar 1A. This structure shown in FIGS. 7A, 7B, 7C, 8A, 8B, and 8C ensures an increased contact area between each second diffusion region 12 and each contact plug 9 as compared to the structures shown in FIGS. 24A, 24B and 24C. The increase of the contact area between each second diffusion region 12 and each contact plug 9 decreases the contact resistance between each second diffusion region 12 and each contact plug 9.

The second inter-layer insulator 11 of silicon oxide is formed over the first inter-layer insulator 7 before the contact plugs 9 are formed. This process can prevent that the voids 8 once filled up with the insulating material for the second inter-layer insulator 11 are filled up with any conductive material. Namely, this process can prevent that the insulating material that fills up the voids 8 in the first inter-layer insulator 7 fills up the voids 8. Thus, any conductive material for the contact plugs 9 does not fill the voids 8 already filled up with the insulating material for the second inter-layer insulator 11. The insulating material filling up the voids 8 of the first inter-layer insulator 7 may provide no connection to the gate electrode 5 that is positioned closest to the void. Namely, no short circuits may be formed between the insulating material filling up the voids 8 of the first inter-layer insulator 7 and the gate electrodes 5. This may avoid formation of short circuits between the voids 8 of the first inter-layer insulator 7 and the gate electrodes 5.

Second Embodiment

A semiconductor device including pillar transistors will be described with reference to the drawings of FIGS. 9A, 9B and 9C. A semiconductor device 20 of the second embodiment may be different in first and second inter-layer insulators from the above-described semiconductor device 10 of the second embodiment.

The semiconductor device 20 may perform as a vertical MOS transistor. The semiconductor device 20 may include pillars. The semiconductor device 20 may include a semiconductor substrate 1. The semiconductor substrate 1 may include, but is not limited to, a base 1a and pillars 1A. Each pillar 1A performs as a body of the transistor. The pillars 1A extend vertically from the base 1a. The pillars 1A are spatially separate from each other. In some cases, the semiconductor substrate 1 may be, but is not limited to, a silicon substrate 1. Each pillar 1A has a side surface 1b.

The semiconductor device 20 may further include gate insulating films 4. Each gate insulating film 4 covers the side surface 1b of the pillar 1A and the surface of the base 1a of the semiconductor substrate 1. The semiconductor device 20 may further include gate electrodes 5. Each gate electrode 5 covers the gate insulating film 4. Each gate electrode 5 surrounds the combined structure of the pillar 1A and the gate insulating film 4. The gate insulating film 4 separates the gate electrode 5 from the pillar 1A and from the base 1a.

The semiconductor device 20 may further include a first diffusion region 6 and a second diffusion region 12. The first diffusion region 6 is positioned in a shallow region of the base 1a of the semiconductor substrate 1, except under the pillars 1A. The first diffusion region 6 is positioned under the gate insulating film 4. The first diffusion region 6 is positioned at a lower level than the pillars 1A. The first diffusion region 6 does not extend under the pillars 1A. The first diffusion regions 6 perform as one of the source and drain regions of the transistor. The second diffusion regions 12 form the top surfaces 1c of the pillars 1A. Each second diffusion region 12 forms the top surface 1c of the pillar 1A. Each second diffusion region 12 is positioned at a higher level than the pillars 1A. Each second diffusion region 12 performs as another of the source and drain regions of the transistor. A channel region is formed in the pillar 1A. The channel region vertically extends between the first diffusion region 6 and each second diffusion region 12. The channel region vertically extends along the gate insulating film 4. The semiconductor device 20 may further include contact plugs 9. The contact plugs 9 contact the second diffusion regions 12. Each contact plug 9 is in contact with the entire area of the top surface of the pillar 1A.

The semiconductor substrate 1 may include the base 1a and the pillars 1A. In some cases, the base 1a may have a planar surface. The pillars 1A may extend vertically from the planar surface of the base 1a. In some cases, each pillar 1 may have a pillar shape. Each pillar 1 has a generally elliptical shape in its cross sectional horizontal view. Each pillar 1 has a top surface 1c that has a generally elliptical shape. In some cases, the pillars 1A may be almost uniform in its height.

In some cases, the semiconductor substrate 1 may be, but is not limited to, a silicon substrate 1 which includes the silicon base 1a and the silicon pillars 1A. In other cases, the semiconductor substrate 1 may be, but is not limited to, a substrate that is covered with a silicon layer, wherein the silicon layer includes the silicon base 1a and the silicon pillars 1A.

In some cases, the gate insulating film 4 may be, but is not limited to, a silicon oxide film 4 which covers the side surface 1b of the pillar 1A. In some cases, the gate electrode 5 may be, but is not limited to, a polysilicon film that is doped with an impurity such as phosphorous. The gate electrode 5 is in contact with the gate insulating film 4. The gate electrode 5 covers the gate insulating film 4 that further covers the side surface 1b of the pillar 1A.

In some cases, the first diffusion region 6 may be, but is not limited to, a diffusion region that contains a dopant, wherein the dopant can be ion-implanted into the diffusion region. The first diffusion region 6 is disposed in the base 1a of the semiconductor substrate 1. In some cases, the first diffusion region 6 may have a concentration of phosphorus, but is not limited to, about $1E15\ cm^{-3}$.

In some cases, each second diffusion region 12 may be, but is not limited to, a diffusion region that contains a dopant, wherein the dopant can be ion-implanted into the diffusion region. Each second diffusion region 12 forms the top surface 1c of the pillar 1A. In some cases, each second diffusion region 12 may have a concentration of phosphorus, but is not limited to, about $2.5E15\ cm^{-3}$.

Each contact plug 9 is in contact with the entire surface 1c of the second diffusion region 12 that forms the top surface 1c of the pillar 1A. Each contact plug 9 is in contact with the entire surface 1c of the pillar 1A. Each contact plug 9 may have a multi-layered structure, but not limited thereto. In some cases, each contact plug 9 may include three layers, such as a titanium layer (Ti), a titanium nitride layer (TiN), and a tungsten layer (W). The titanium layer (Ti) is in contact with the entire surface 1c of the second diffusion region 12. The titanium nitride layer (TiN) is disposed on the titanium layer (Ti). The tungsten layer (W) is disposed on the titanium nitride layer (TiN). Each contact plug 9 has a bottom face 9a. In some cases, but not essentially and rather optionally, the center position of the bottom face 9a of each contact plug 9 may be aligned to the center position of the top surface 1c of the pillar 1A and the diameter of the bottom surface 9a of the contact plug 9 is same as the diameter of the top surface 1c of the pillar 1A. Each contact plug 9 has a top face 9b. In some cases, the top face 9b has a generally elliptical shape. The top face 9b of each contact plug 9 may be slightly larger than the bottom face 9a thereof.

Each contact plug 9 is in contact with the entire area of the top surface of the pillar 1A. This structure ensures an increased contact area between each second diffusion region 12 and each contact plug 9 as compared to the structures. The increase of the contact area between each second diffusion region 12 and each contact plug 9 decreases the contact resistance between each second diffusion region 12 and each contact plug 9.

The center position of the bottom face 9a of each contact plug 9 may be aligned to the center position of the top surface 1c of the pillar 1A and the diameter of the bottom surface 9a of the contact plug 9 may be the same as the diameter of the top surface 1c of the pillar 1A. This structure can prevent that each contact plug 9 from extending outside the top surface 1c of the pillar 1A. This structure can prevent that each contact plug 9 from contacting the gate electrode 5, thereby preventing a short circuit from being formed between the contact plug 9 and the gate electrode 5.

The semiconductor device 20 may further include a first inter-layer insulator 17. The first inter-layer insulator 17 fills the inter-space that extends around the pillars 1A and the contact plugs 9. The inter-space is defined by the gate electrodes 5 and the gate insulating films 4 that surround the pillars 1A and by the contact plugs 9. The top surface of the first inter-layer insulator 17 is higher in level than the top surfaces 1c of the pillars 1A. The top surface of the first inter-layer insulator 17 is higher in level than the second diffusion region 12 that forms the top surface 1c of the pillar 1A. The top surface of the first inter-layer insulator 17 is lower in level than the top surfaces of the contact plugs 9. The first inter-layer insulator 17 is in contact with the gate electrodes 5 and the gate insulating films 4 as well as contact the contact plugs 9. In some cases, the first inter-layer insulator 17 may be, but is not limited to, a silicon nitride film.

The semiconductor device 20 may further include a second inter-layer insulator 18. The second inter-layer insulator 18 is disposed on the top surface of the first inter-layer insulator 17. The second inter-layer insulator 18 fills the inter-space that extends around the contact plugs 9. The inter-space is defined by the contact plugs 9 and the top surface of the first inter-layer insulator 17. In some cases, the second inter-layer insulator 18 may be, but is not limited to, a silicon oxide film. In some cases, the first and second inter-layer insulators 17 and 18 may be made of different insulating materials that are different in etching rate from each other.

As shown in FIG. 9C, the first inter-layer insulator 17 may have voids 8. The voids 8 in the first inter-layer insulator 17 are filled up with the insulating material for the second inter-layer insulator 18. If the second inter-layer insulator 18 is made of silicon oxide, then the voids 8 in the first inter-layer insulator 17 are filled up with silicon oxide. The voids 8 once filled up with the insulating material for the second inter-layer insulator 18 are prevented from being filled up with any conductive material. Namely, the insulating material that fills up the voids 8 in the first inter-layer insulator 17 prevents the voids 8 from being filled up with any conductive material. Thus, any conductive material for the contact plugs 9 does not fill the voids 8 already filled up with the insulating material for the second inter-layer insulator 18. The insulating material filling up the voids 8 of the first inter-layer insulator 17 may provide no connection to the gate electrode 5 that is positioned closest to the void. Namely, no short circuits may be formed between the insulating material filling up the voids 8 of the first inter-layer insulator 17 and the gate electrodes 5. This may avoid formation of short circuits between the voids 8 of the first inter-layer insulator 17 and the gate electrodes 5.

Each contact plug 9 is in contact with the entire area of the top surface of the pillar 1A. This ensures the largest possible contact area between the contact plugs 9 and the second diffusion layers 12. Ensuring the largest possible contact area between the contact plugs 9 and the second diffusion layers 12 ensures the smallest possible contact resistance between the contact plugs 9 and the second diffusion layers 12.

A method of forming above-described semiconductor device 20 may include, but is not limited to, a hard mask formation process, a pillar formation process, a gate insulating film formation process, a gate electrode formation process, a first diffusion region formation process, a first inter-layer insulator formation process, a second inter-layer insulator formation process, a contact hole formation process, a second diffusion region formation process, and a contact plug formation process.

The hard mask formation process may be, but is not limited to, a process for forming a hard mask over a semiconductor substrate, wherein the hard mask may be made of the same material as the second inter-layer insulator.

The pillar formation process may be, but is not limited to, a process for forming pillars and a base from the semiconductor substrate by using the hard mask.

The gate insulating film formation process may be, but is not limited to, a process for forming gate insulating films on side surfaces of the pillars.

The gate electrode formation process may be, but is not limited to, a process for forming gate electrodes on the gate insulating films that have been formed on the side surfaces of the pillars. The combination of the gate electrode and the gate insulating film surrounds the side surface of each pillar.

The first diffusion region formation process may be, but is not limited to, a process for selectively forming a first diffusion region in a shallow region, except under the pillars, of the base of the semiconductor substrate. The first diffusion region does not extend to under the pillars.

The first inter-layer insulator formation process may be, but is not limited to, a process for filling the first inter-layer insulator into inter-spaces among the pillars combined with the hard masks, and a subsequent process for planarize the first inter-layer insulator.

The second inter-layer insulator formation process may be, but is not limited to, a process for forming a second inter-layer insulator over the hard mask and the first inter-layer insulator.

The contact hole formation process may be, but is not limited to, a process for forming contact holes after the hard mask is removed.

The second diffusion region formation process may be, but is not limited to, a process for forming second diffusion regions at the upper portions of the pillars.

The contact plug formation process may be, but is not limited to, a process for forming contact plugs in the contact holes.

The processes for forming the semiconductor device including pillar transistors will be described in details with reference to the drawings of FIGS. 10A, 10B, 10C through FIGS. 15A, 15B, 15C.

(Hard Mask Formation Process)

The hard mask formation process will be described for forming a hard mask 16 over a semiconductor substrate 1, wherein the hard mask 16 may be made of the same material as a second inter-layer insulator 18.

With reference to FIGS. 10A, 10B and 10C, a semiconductor substrate 1 such as a silicon substrate 1 is prepared. A thermal oxidation process is carried out to form an oxide film 2 such as a silicon oxide film 2 on a surface of the semiconductor substrate 1. In some cases, the thermal oxidation process can be carried out at a temperature of about 850° C. for 10 minutes.

With reference to FIGS. 11A, 11B and 11C, a silicon oxide film is formed over the oxide film 2 such as the silicon oxide film 2. In some cases, the thickness of the silicon oxide film may be, but is not limited to, 100 nanometers. In some cases, the silicon oxide film can be formed by a chemical vapor deposition process. A lithography process and a dry etching process are carried out to pattern the silicon oxide film, thereby forming hard masks 16 of silicon nitride on the oxide film 2 such as the silicon oxide film 2. In some cases, the hard masks 16 may each have, but not limited to, an elliptical shape in plan view as shown in FIG. 11A, wherein the ellipse of the hard masks 16 of silicon nitride has a semi-major axis that is parallel to the A-A' line of FIG. 11A, and a semi-minor axis that is parallel to the B-B' line of FIG. 11A.

(Pillar Formation Process)

The pillar formation process will be described in details for forming pillars 1A and a base 1a from the semiconductor substrate 1 by using the hard mask 16.

With reference again to FIGS. 11A, 11B and 11C, a dry etching process is carried out using the hard masks 16 of silicon nitride to selectively and anisotropically etch the oxide film 2 and the semiconductor substrate 1, thereby forming a plurality of pillars under the hard masks 16 of silicon nitride. The plurality of pillars 1A of semiconductor or silicon is a part of the semiconductor substrate 1. In other words, the semiconductor substrate 1 includes the plurality of pillars 1A and a base portion 1a. The plurality of pillars 1A extends vertically from the base portion 1a of the semiconductor substrate 1 as shown in FIGS. 11B and 11C. The plurality of pillars 1A extends vertically from the semiconductor substrate 1. Each pillar 1A has a side surface 1b.

(Gate Insulating Film Formation Process)

The gate insulating film formation process will be described in details for forming gate insulating films 4 on the side surfaces 1b of the pillars 1A.

With reference to FIGS. 12A, 12B and 12C, a gate insulating film 4 such as a gate oxide film 4 is formed on the surfaces of the semiconductor substrate 1. Namely, the gate insulating film 4 is formed on the side surfaces 1b of the plurality of pillars 1A and the surface of the semiconductor substrate 1. The gate insulating film 4 extends along the side surfaces 1b of the plurality of pillars 1A and the surface of the semiconductor substrate 1. The gate oxide film 4 surrounds each of the plurality of pillars 1A. The gate oxide film 4 can be formed by, but not limited to, a thermal oxidation process. In some cases, the thermal oxidation process can be carried out at a temperature of about 1000° C. for one minute. The plurality of pillars 1A that are each surrounded by the gate oxide film 4 defines an inter-space. The inter-space is defined by the surface of the semiconductor substrate 1 and by the gate oxide film 4 extending along the side surfaces 1b of the plurality of pillars 1A. In other words, the inter-space is a space that extends outside the plurality of pillars 1A.

(Gate Electrode Formation Process)

The gate electrode formation process will be described in details for forming gate electrodes 5 on the gate insulating films 4 that have been formed on the side surfaces 1b of the pillars 1A. The combination of the gate electrode 5 and the gate insulating film 4 surrounds the side surface 1b of each pillar 1A.

With reference again to FIGS. 12A, 12B and 12C, a plurality of gate electrodes 5 is formed on the gate oxide film 4 that surrounds each of the plurality of pillars 1A. Each gate electrode 5 is in contact with a part of the gate oxide film 4, wherein the part of the gate oxide film 4 is in contact with the side surface 1b of the pillar 1A. Each gate electrode 5 surrounds the pillar 1A and a part of the gate oxide film 4, wherein the part of the gate oxide film 4 is in contact with the side surface 1b of the pillar 1A. Each pillar 1A is surrounded by the gate oxide film 4 and the gate electrode 5. As shown in FIGS. 12A and 12B, first pair of two adjacent gate electrodes 5 are in contact with each other. The first pair of two adjacent gate electrodes 5 surround first pair of two adjacent pillars 1A that are aligned on the semi-major axis, wherein the first pair of two adjacent gate electrodes 5 are in contact with each other at a contact point in plan view that is positioned on the semi-major axis. As shown in FIGS. 12A and 12C, second pair of two adjacent gate electrodes 5 are separate from each other. The second pair of two adjacent gate electrodes 5 surrounds second pair of two adjacent pillars 1A that are aligned on the semi-minor axis, wherein the second pair of two adjacent gate electrodes 5 separate each other.

In some cases, the thickness of each gate electrode 5 may be so thick that the first pair of two adjacent gate electrodes 5 are in contact with each other at a contact point in plan view that is positioned on the semi-major axis as shown in FIGS. 12A and 12B, while the second pair of two adjacent gate electrodes 5 are separate from each other as shown in FIGS. 12A and 12C. No spatial gap is present between the first pair of two adjacent gate electrodes 5 that are aligned on the semi-major axis parallel to the A-A' line of FIGS. 12A and 12B. A spatial gap is present between the second pair of two adjacent gate electrodes 5 that are aligned on the semi-minor axis parallel to the B-B' line of FIGS. 12A and 12C.

In some cases, the gate electrodes 5 may be made of, but not limited to, a polysilicon that contains an impurity. Typically, the gate electrodes 5 may be made of, but not limited to, an in-situ phosphorus-doped polysilicon. In this case, the gate electrodes 5 can be formed by follows. An in-situ phosphorus-doped polysilicon film is formed entirely over the semiconductor substrate 1 by a chemical vapor deposition process. The in-situ phosphorus-doped polysilicon film is formed on the gate oxide film 4 and on the hard masks 16 of silicon nitride. A dry etching process can be carried out to etch back the in-situ phosphorus-doped polysilicon film, thereby forming the gate electrodes 5. Each gate electrode 5 is in contact with a part of the gate oxide film 4, wherein the part of the gate oxide film 4 is in contact with the side surface 1b of the pillar 1A. Each gate electrode 5 surrounds the pillar 1A and a part of the gate oxide film 4, wherein the part of the gate oxide film 4 is in contact with the side surface 1b of the pillar 1A.

(First Diffusion Region Formation Process)

The first diffusion region formation process will be described in details for selectively forming a first diffusion region 6 in a shallow region, except under the pillars 1A, of the base 1a of the semiconductor substrate 1. The first diffusion region 6 does not extend to under the pillars 1A. The first diffusion region 6 may perform as one of the source and drain regions.

With reference again to FIGS. 12A, 12B and 12C, a first diffusion layer 6 is selectively formed in shallow regions of the semiconductor substrate 1. The part of the gate insulating film 4 extends over the surface of the semiconductor substrate 1. The shallow regions extend under the surface of the semiconductor substrate 1. The first diffusion layer 6 is positioned under the part of the gate insulating film 4, wherein the part of the gate insulating film 4 extends over the surface of the semiconductor substrate 1. The first diffusion layer 6 does not extend under the pillars 1A. The first diffusion layer 6 extends within the shallow region of the semiconductor substrate 1, except under the pillars 1A that extend upwardly from the semiconductor substrate 1. In some cases, the first diffusion layer 6 may contain, but not limited to, phosphorous. Typically, the first diffusion layer 6 can be formed by, but not limited to, a selective ion-implantation process. The selective ion-implantation process can be carried out by introducing phosphorous ions into the semiconductor substrate 1, except under the pillars 1A. The dose of the ion-implantation may be, but is not limited to, about $1E15$ $cm^{-2}$.

(First Inter-Layer Insulator Formation Process)

The first inter-layer insulator formation process will be described in details for filling the first inter-layer insulator 17 into inter-spaces among the pillars 1A combined with the hard masks 16, and a subsequent process for planarize the first inter-layer insulator 17.

Figure 13A:
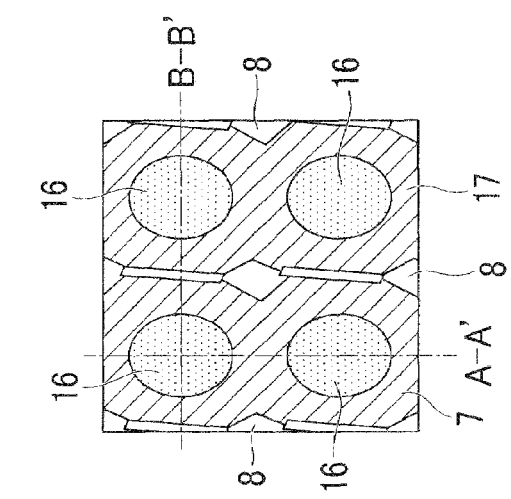
FIG. 13A is a fragmentary plan view illustrating a step, subsequent to the step of FIGS. 12A, 12B, and 12C, involved in a method of forming the semiconductor device including pillar transistors shown in FIGS. 9A, 9B, and 9C, in accordance with the second preferred embodiment of the present invention.
Figure 13B:
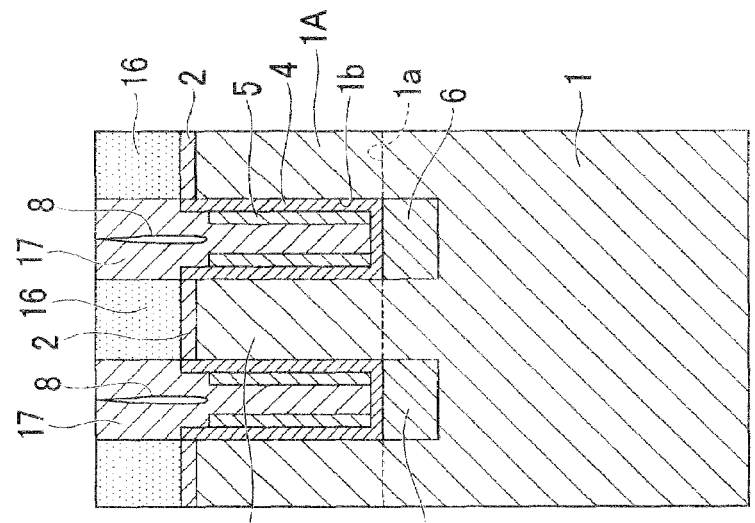
FIG. 13B is a fragmentary cross sectional elevation view, taken along an A-A' line of FIG. 13A, illustrating the step, subsequent to the step of FIGS. 12A, 12B, and 12C, involved in a method of forming the semiconductor device including pillar transistors in accordance with the second preferred embodiment of the present invention.
Figure 13C:
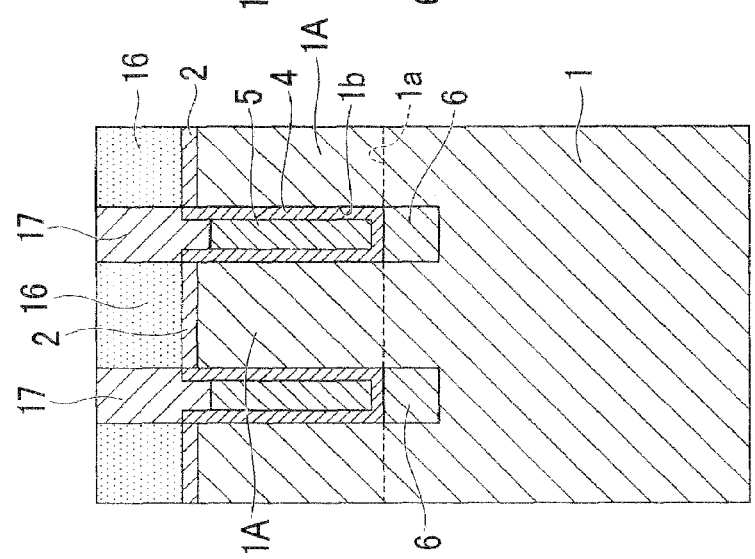
FIG. 13C is a fragmentary cross sectional elevation view, taken along a B-B' line of FIG. 13A, illustrating step, subsequent to the step of FIGS. 12A, 12B, and 12C, involved in a method of forming the semiconductor device including pillar transistors in accordance with the second preferred embodiment of the present invention.

With reference to FIGS. 13A, 13B and 13C, a first inter-layer insulator 17 is formed to fill the inter-space that extends around the pillars 1A with the hard masks 16 of silicon nitride. In some cases, the first inter-layer insulator 17 may be, but is not limited to, an oxide film. The first inter-layer insulator 17 can be formed as follows. A first insulating film can be formed entirely over the semiconductor substrate 1 and the hard masks 16 of silicon nitride. The first insulating film may be made of silicon nitride. The first insulating film of silicon nitride can be formed by, but not limited to, a plasma enhanced chemical vapor deposition process. The inter-space that extends around the pillars 1A with the hard masks 16 of silicon nitride is incompletely filled with the first insulating film of silicon nitride, so that as shown in FIG. 13C, voids 8 are formed in the first insulating film that fills the inter-space that extends around the pillars 1A with the hard masks 16. The first insulating film of silicon nitride is then polished by a chemical mechanical polishing process so that the surface of the hard masks 16 is shown, thereby forming the first inter-layer insulator 17 of silicon oxide. In some cases, the chemical mechanical polishing process can be carried out by, but not limited to, using the hard masks 16 of silicon nitride as a polishing stopper, and using ceria as a polishing agent. The surface of the first inter-layer insulator 17 of silicon oxide is leveled to the surface of the hard masks 16 of silicon nitride, so that the surface of the first inter-layer insulator 17 of silicon oxide and the surface of the hard masks 16 of silicon nitride make up a planarized surface. The first inter-layer insulator 17 of silicon oxide may not completely fill the inter-space that extends around the pillars 1A with the hard masks 16 of silicon nitride, while the voids 8 are formed in the first inter-layer insulator 17 of silicon oxide.

(Second Inter-Layer Insulator Formation Process)

The second inter-layer insulator formation process will be described in details for forming a second inter-layer insulator 18 of silicon nitride over the hard mask 16 of silicon nitride and over the first inter-layer insulator 17 of silicon oxide.

With reference to FIGS. 14A, 14B and 14C, a second inter-layer insulator 18 of silicon nitride is formed over the hard mask 16 of silicon nitride and over the first inter-layer insulator 17 of silicon oxide, while the voids 8 in the first inter-layer insulator 17 are filled up with silicon nitride.

(Contact Hole Formation Process)

The contact hole formation process will be described in details for forming contact holes after the hard mask 16 is removed.

With reference to FIGS. 15A, 15B and 15C, contact holes can be formed by patterning the second inter-layer insulator 18 of silicon nitride and removal of the hard mask 16 of silicon nitride, while using the first inter-layer insulator 17 of silicon oxide as an etching stopper. Both the second inter-layer insulator 18 and the hard mask 16 are made of the same insulating material, for example, silicon nitride. The second inter-layer insulator 18 of silicon nitride is selectively removed so that the second inter-layer insulator 18 of silicon nitride remains over the first inter-layer insulator 17 of silicon oxide. The hard mask 16 of silicon nitride is entirely removed, so that the entire top surfaces 1c of the pillars 1A are shown. The contact holes are self-aligned to the entire top surfaces 1c of the pillars 1A. The patterning process for patterning the second inter-layer insulator 18 of silicon nitride can be carried out by a lithography process and a dry etching process. The second inter-layer insulator 18 of silicon nitride is patterned so that the pattern of the second inter-layer insulator 18 is positioned over the first inter-layer insulator 17 of silicon oxide. The pattern of the second inter-layer insulator 18 does not extend outside the first inter-layer insulator 17 of silicon oxide. The pattern of the second inter-layer insulator 18 has side edges that may be positioned inside the side edges of the first inter-layer insulator 17 of silicon oxide.

An anisotropic etching process can be carried out under conditions that the etching rate of silicon nitride is higher than the etching rate of silicon oxide. In other words, the anisotropic etching process can be carried out under conditions that silicon nitride is etched, while silicon oxide is not substantially etched. Carrying out the anisotropic etching process under such conditions of the anisotropic etching process allow the first inter-layer insulator 17 of silicon oxide to perform as an etching stopper. Typically, the anisotropic etching process may be a dry etching process. The anisotropic etching process is carried out using the first inter-layer insulator 17 of silicon oxide as an etching stopper. The second inter-layer insulator 18 of silicon nitride is selectively etched to as to form the pattern of the second inter-layer insulator 18 and also remove the hard mask 16 of silicon nitride. The pattern of the second inter-layer insulator 18 is positioned over the first inter-layer insulator 17 of silicon oxide. The pattern of the second inter-layer insulator 18 does not extend outside the first inter-layer insulator 17 of silicon oxide. The hard mask 16 of silicon nitride is removed so that the side surfaces of the upper portion of the first inter-layer insulator 17 of silicon oxide are exposed to the contact holes, and that the entire top surfaces 1c of the pillars 1A are exposed to the contact holes. Each contact hole is defined by the entire top surfaces 1c of the pillars 1A and the side surfaces of the upper portion of the first inter-layer insulator 17 of silicon oxide. Each contact hole is self-aligned to the entire top surfaces 1c of the pillars 1A.

(Second Diffusion Region Formation Process)

The second diffusion region formation process will be described in details for forming second diffusion regions 12 on the entire top surfaces 1c of the pillars 1A.

With reference again to FIGS. 15A, 15B and 15C, second diffusion layers 12 are formed over the top surfaces 1c of the pillars 1A. The second diffusion layers 12 do not extend to the first inter-layer insulator 17 and to the gate insulating film 4. The second diffusion layers 12 can be formed by, but not limited to, an ion-implantation process. Typically, the ion-implantation process can be carried out by introducing phosphorous ions into the upper portions of the pillars 1A at a dose of about $2.5E15$ $cm^{-2}$, wherein the upper portions of the pillars 1A are positioned under the contact holes. Typically but not limited to, the upper portions of the pillars 1A may be positioned directly under the contact holes. The second diffusion layers 12 are positioned under the contact holes. Typically but not limited to, the second diffusion layers 12 may be positioned directly under the contact holes. The second diffusion layers 12 are lower in level than the top portions of the gate insulating films 4. Typically, the second diffusion layers 12 may have the bottom level that is similar in level to the top portions of the gate electrodes 5.

(Contact Plug Formation Process)

The contact plug formation process will be described in details for forming contact plugs 9 in the contact holes.

With reference again to FIGS. 15A, 15B and 15C, contact plugs 9 are formed on the second diffusion layers 12, so that the contact plugs 9 fill up the openings of the contact holes. The contact plugs 9 contact the second diffusion layers 12 and the side surfaces of the upper portion of the first inter-layer insulator 107. In some cases, the contact plugs 9 can be made of one or more metals. The contact plugs 9 can be formed by, but not limited to, a known process. In some cases, the contact plugs 9 can be formed as follows. A titanium film is formed on inside walls of the contact holes by a sputtering process, so that the inside walls of the contact holes are covered by the titanium film. A barrier film is formed on the titanium film. In some cases, the barrier film may be, but is not limited to, a titanium nitride film. Typically, the titanium nitride film may be formed by, but not limited to, a chemical vapor deposition process. A tungsten film is formed entirely over the semiconductor substrate 1, so that the tungsten film covers the barrier film and the second inter-layer insulator 18. The tungsten film is then polished by a chemical mechanical polishing process until the top surface of the second inter-layer insulator 18 is exposed thereby forming the contact plugs 9. The contact plugs 9 have the top surfaces that are similar in level to the top surface of the second inter-layer insulator 18. As a result, a semiconductor device has been completed as shown in FIGS. 15A, 15B and 15C.

Each contact plug 9 is in contact with the entire area of the top surface of the pillar 1A. This structure shown in FIGS. 15A, 15B and 15C ensures an increased contact area between each second diffusion region 12 and each contact plug 9 as compared to the structures shown in FIGS. 24A, 24B and 24C. The increase of the contact area between each second diffusion region 12 and each contact plug 9 decreases the contact resistance between each second diffusion region 12 and each contact plug 9.

As described above, the center position of the bottom face 9a of each contact plug 9 may be aligned to the center position of the top surface 1c of the pillar 1A and the diameter of the bottom surface 9a of the contact plug 9 may be same as the diameter of the top surface 1c of the pillar 1A as shown in FIGS. 15A, 15B and 15C. This structure shown in FIGS. 15A, 15B and 15C can prevent that each contact plug 9 from extending outside the top surface 1c of the pillar 1A as shown in FIGS. 15A, 15B and 15C. This structure can prevent that each contact plug 9 from contacting the gate electrode 5, thereby preventing a short circuit from being formed between the contact plug 9 and the gate electrode 5.

As described above, if the second inter-layer insulator 18 is made of silicon oxide, then the voids 8 in the first inter-layer insulator 17 are filled up with silicon oxide as shown in FIGS. 15A, 15B and 15C. The voids 8 once filled up with the insulating material for the second inter-layer insulator 18 are prevented from being filled up with any conductive material. Namely, the insulating material that fills up the voids 8 in the first inter-layer insulator 17 prevents the voids 8 from being filled up with any conductive material. Thus, any conductive material for the contact plugs 9 does not fill the voids 8 already filled up with the insulating material for the second inter-layer insulator 18. The insulating material filling up the voids 8 of the first inter-layer insulator 17 may provide no connection to the gate electrode 5 that is positioned closest to the void. Namely, no short circuits may be formed between the insulating material filling up the voids 8 of the first inter-layer insulator 17 and the gate electrodes 5. This may avoid formation of short circuits between the voids 8 of the first inter-layer insulator 17 and the gate electrodes 5.

As described above, the contact holes can be formed by patterning the second inter-layer insulator 18 of silicon nitride and removal of the hard mask 16 of silicon nitride, while using the first inter-layer insulator 17 of silicon oxide as an etching stopper. Both the second inter-layer insulator 18 and the hard mask 16 are made of the same insulating material, for example, silicon nitride. The second inter-layer insulator 18 of silicon nitride is selectively removed so that the second inter-layer insulator 18 of silicon nitride remains over the first inter-layer insulator 17 of silicon oxide. The hard mask 16 of silicon nitride is entirely removed, so that the entire top surfaces 1c of the pillars 1A are shown. The contact holes are self-aligned to the entire top surfaces 1c of the pillars 1A. The second inter-layer insulator 18 of silicon nitride is patterned so that the pattern of the second inter-layer insulator 18 is positioned over the first inter-layer insulator 17 of silicon oxide. The pattern of the second inter-layer insulator 18 does not extend outside the first inter-layer insulator 17 of silicon oxide. The pattern of the second inter-layer insulator 18 has side edges that may be positioned inside the side edges of the first inter-layer insulator 17 of silicon oxide. The center position of the bottom face 9a of each contact plug 9 is then self-aligned to the center position of the top surface 1c of the pillar 1A as shown in FIGS. 15A, 15B and 15C. This process can prevent that each contact plug 9 from extending outside the top surface 1c of the pillar 1A as shown in FIGS. 15A, 15B and 15C. This process can prevent that each contact plug 9 from contacting the gate electrode 5, thereby preventing a short circuit from being formed between the contact plug 9 and the gate electrode 5.

As described above, the anisotropic etching process can be carried out under conditions that the etching rate of silicon oxide is higher than the etching rate of silicon nitride. In other words, the anisotropic etching process can be carried out under conditions that silicon oxide is etched, while silicon nitride is not substantially etched. Carrying out the anisotropic etching process under such conditions of the anisotropic etching process allow the first inter-layer insulator 17 of silicon oxide to perform as an etching stopper. The anisotropic etching process is carried out using the first inter-layer insulator 17 of silicon oxide as an etching stopper. The second inter-layer insulator 18 of silicon nitride is selectively etched to as to form the pattern of the second inter-layer insulator 18 and also remove the hard mask 16 of silicon oxide. The pattern of the second inter-layer insulator 18 is positioned over the first inter-layer insulator 17 of silicon oxide. The pattern of the second inter-layer insulator 18 does not extend outside the first inter-layer insulator 17 of silicon oxide. The hard mask 16 of silicon oxide is removed so that the side surfaces of the upper portion of the first inter-layer insulator 17 of silicon oxide are exposed to the contact holes, and that the entire top surfaces 1c of the pillars 1A are exposed to the contact holes. Each contact hole is self-aligned to the entire top surfaces 1c of the pillars 1A.

The center position of the bottom face 9a of each contact plug 9 is then self-aligned to the center position of the top surface 1c of the pillar 1A and the diameter of the bottom surface 9a of the contact plug 9 is same as the diameter of the top surface 1c of the pillar 1A as shown in FIGS. 15A, 15B and 15C. This process can prevent that each contact plug 9 from extending outside the top surface 1c of the pillar 1A as shown in FIGS. 15A, 15B and 15C. This process can prevent that each contact plug 9 from contacting the gate electrode 5, thereby preventing a short circuit from being formed between the contact plug 9 and the gate electrode 5. Further, each contact plug 9 is in contact with the entire area of the top surface of the pillar 1A. This structure shown in FIGS. 15A, 15B and 15C ensures an increased contact area between each second diffusion region 12 and each contact plug 9 as compared to the structures shown in FIGS. 24A, 24B and 24C. The increase of the contact area between each second diffusion region 12 and each contact plug 9 decreases the contact resistance between each second diffusion region 12 and each contact plug 9.

The second inter-layer insulator 18 of silicon nitride is formed over the first inter-layer insulator 17 before the contact plugs 9 are formed. This process can prevent that the voids 8 once filled up with the insulating material for the second inter-layer insulator 18 are filled up with any conductive material. Namely, this process can prevent that the insulating material that fills up the voids 8 in the first inter-layer insulator 17 fills up the voids 8. Thus, any conductive material for the contact plugs 9 does not fill the voids 8 already filled up with the insulating material for the second inter-layer insulator 18. The insulating material filling up the voids 8 of the first inter-layer insulator 17 may provide no connection to the gate electrode 5 that is positioned closest to the void. Namely, no short circuits may be formed between the insulating material filling up the voids 8 of the first inter-layer insulator 17 and the gate electrodes 5. This may avoid formation of short circuits between the voids 8 of the first inter-layer insulator 17 and the gate electrodes 5.

The above described structures in accordance with the first and second embodiments can be applied to other semiconductor devices such as a vertical diode. The above described processes in accordance with the first and second embodiments can be applied to processes for forming other semiconductor devices such as a vertical diode. The above described structures in accordance with the first and second embodiments can be applied to the structure, which the contact plug is connected to the entire of the top surface of the pillar. The above described structures in accordance with the first and second embodiments can be applied to the processes, which the contact plug is formed to be connected to the entire of the top surface of the pillar.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device, comprising:
a semiconductor substrate including a base and at least a pillar;
a first diffusion region in the base;
a gate insulating film that covers a side surface of the pillar;
a gate electrode separated from the pillar by the gate insulating film;
a second diffusion region in an upper portion of the pillar;
a contact plug connected to the second diffusion region, the contact plug being in contact with a top surface of the pillar, wherein an entire area of the top surface of the pillar is covered by a bottom surface of the contact plug; and
a first inter-layer insulator surrounding the pillar, the gate insulating film, the gate electrode, and a lower portion of the contact plug,
wherein the first inter-layer insulator has a top that is higher in level than the top surface of the pillar, and
wherein the gate insulating film extends over the first diffusion region and covers a side surface of the second diffusion region in the pillar.

2. The semiconductor device according to claim 1, wherein a diameter of a bottom surface of the contact plug is same as a diameter of the top surface of the pillar, and a center position of the top surface of the pillar is aligned to a center position of the bottom surface of the contact plug.

3. The semiconductor device according to claim 1, further comprising:
a second inter-layer insulator disposed over the first inter-layer insulator, the second inter-layer insulator surrounding an upper portion of the contact plug,
wherein the first and second inter-layer insulators are different in etching rate from each other.

4. The semiconductor device according to claim 3, wherein the first inter-layer insulator includes a void that is filled with the same material as the second inter-layer insulator.

5. The semiconductor device according to claim 1, wherein the first diffusion region extends in the base, except under the pillar.

6. The semiconductor device according to claim 1, wherein the at least one pillar is an array of pillars that extend from the base.

7. A semiconductor device, comprising:
a semiconductor substrate;
a plurality of pillars disposed on the semiconductor substrate;
at least a diffusion region formed in the semiconductor substrate;
a gate insulating film that covers a side surface of each of the pillars;
a plurality of gate electrodes facing to side surfaces of each of the pillars with an intervention of the gate insulating film therebetween;
a plurality of second diffusion regions in upper portions of each of the pillars;
a plurality of contact plugs connected to the second diffusion regions, each of the contact plugs being in contact with top surfaces of each of the pillars, wherein an entire area of the top surface of each of the pillars is covered by a bottom surface of a respective one of the contact plugs; and
a first inter-layer insulator surrounding each of the pillars, the gate insulating film, each of the gate electrodes, and a lower portion of each of the contact plugs,
wherein the first inter-layer insulator has a top that is higher in level than the top surface of each of the pillars, and
wherein the first diffusion region is formed at an area which surrounds each of the pillars.

8. The semiconductor device according to claim 7, wherein a diameter of the top surface of each of the pillars is the same as a diameter of the bottom surface of a respective one of the contact plugs.

9. The semiconductor device according to claim 7, further comprising:
a second inter-layer insulator disposed over the first inter-layer insulator, the second inter-layer insulator surrounding an upper portion of each of the contact plugs,
wherein the first and second inter-layer insulators are different in etching rate from each other.

10. The semiconductor device according to claim 9, wherein the first inter-layer insulator includes a void that is filled with the same material as the second inter-layer insulator.

11. A semiconductor device, comprising:
a semiconductor substrate;
a plurality of pillars disposed on the semiconductor substrate;
at least a diffusion region formed in the semiconductor substrate;
a gate insulating film that covers a side surface of each of the pillars;
a plurality of gate electrodes facing to side surfaces of each of the pillars with an intervention of the gate insulating film therebetween;
a plurality of second diffusion regions in upper portions of each of the pillars;
a plurality of contact plugs connected to the second diffusion regions, each of the contact plugs being in contact with top surfaces of each of the pillars, wherein an entire area of the top surface of each of the pillars is covered by a bottom surface of a respective one of the contact plugs; and
a first inter-layer insulator surrounding each of the pillars, the gate insulating film, each of the gate electrodes, and a lower portion of each of the contact plugs,
wherein the first inter-layer insulator has a top that is higher in level than the top surface of each of the pillars, and wherein the gate insulating film extends over the first diffusion region and covers side surfaces of the second diffusion regions in each of the pillars.

12. A semiconductor device, comprising:
a semiconductor substrate base layer;
a semiconductor pillar protruding from the semiconductor base layer; and
a contact plug formed in contact with a top surface of the semiconductor pillar, wherein a substantially entire area of the top surface of the semiconductor pillar is covered by the contact plug;
a first diffusion region in the semiconductor base layer;
a gate insulating film that covers a side surface of the semiconductor pillar;
a gate electrode separated from the semiconductor pillar by the gate insulating film;
a second diffusion region in an upper portion of the semiconductor pillar; and
a first inter-layer insulator surrounding the semiconductor pillar, the gate insulating film, the gate electrode, and a lower portion of the contact plug,
wherein the first inter-layer insulator has a top that is higher in level than the top surface of the semiconductor pillar,
a second inter-layer insulator being disposed over the first inter-layer insulator, the second inter-layer insulator surrounding an upper portion of the contact plug.

13. The semiconductor device according to claim 12, wherein a diameter of a bottom surface of the contact plug is substantially the same as a diameter of the top surface of the semiconductor pillar, and a center position of the top surface of the semiconductor pillar is aligned to a center position of the bottom surface of the contact plug.

14. The semiconductor device according to claim 12, wherein the first and second inter-layer insulators are different in etching rate from each other.

15. The semiconductor device according to claim 14, wherein the first inter-layer insulator includes a void that is filled with the same material as the second inter-layer insulator.

16. The semiconductor device according to claim 14, wherein the first diffusion region extends in the semiconductor substrate base layer except under the semiconductor pillar.

17. The semiconductor device according to claim 14, wherein the gate insulating film extends over the first diffusion region and covers a side surface of the second diffusion region in the semiconductor pillar.

18. A semiconductor device, comprising:
a first pillar on the semiconductor device;
a second pillar on the semiconductor device;
a region between the first and second pillar;
a gate insulating film formed in the region;
a gate electrode formed in the region and formed on the gate insulating film;
a plurality of contact plugs formed in contact with a top surface of the first and second pillar, the contact plugs covering a substantially entire area of the top surface of the first and second pillar;
a first inter-layer insulator formed on the region, the first inter-layer insulator formed between the contact plugs; and
a second inter-layer insulator disposed over the first inter-layer insulator, the second inter-layer insulator surrounding an upper portion of the contact plugs,
wherein a width of the region is substantially the same as a width of the first inter-layer insulator.

19. The semiconductor device according to claim 18, wherein the width of the top of first inter-layer insulator is greater than the width of bottom of second inter-layer insulator.

* * * * *